United States Patent
Katayama et al.

(10) Patent No.: US 9,779,936 B2
(45) Date of Patent: Oct. 3, 2017

(54) PLASMA PROCESSING METHOD AND PLASMA PROCESSING APPARATUS

(71) Applicant: TOKYO ELECTRON LIMITED, Tokyo (JP)

(72) Inventors: Daisuke Katayama, Yamanashi (JP); Minoru Honda, Yamanashi (JP); Toshio Nakanishi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/410,741

(22) PCT Filed: Apr. 17, 2013

(86) PCT No.: PCT/JP2013/061372
§ 371 (c)(1),
(2) Date: Dec. 23, 2014

(87) PCT Pub. No.: WO2014/002586
PCT Pub. Date: Jan. 3, 2014

(65) Prior Publication Data
US 2015/0162193 A1    Jun. 11, 2015

(30) Foreign Application Priority Data
Jun. 27, 2012 (JP) ................. 2012-144368

(51) Int. Cl.
*H01L 21/02* (2006.01)
*C23C 16/24* (2006.01)
(Continued)

(52) U.S. Cl.
CPC ........ *H01L 21/02532* (2013.01); *C23C 16/24* (2013.01); *C23C 16/45538* (2013.01);
(Continued)

(58) Field of Classification Search
None
See application file for complete search history.

(56) References Cited

U.S. PATENT DOCUMENTS

| 5,221,643 A * | 6/1993 | Griep | ...................... C23C 16/24 |
| | | | 148/DIG. 122 |
| 6,447,850 B1 * | 9/2002 | Ebe | ......................... C23C 16/24 |
| | | | 257/E21.101 |

(Continued)

FOREIGN PATENT DOCUMENTS

| JP | 8-255759 A | 10/1996 |
| JP | 2001-144258 A | 5/2001 |

(Continued)

OTHER PUBLICATIONS

International Search Report mailed Jun. 18, 2013 in PCT/JP2013/061372.

*Primary Examiner* — Reema Patel
*Assistant Examiner* — Steven Christopher
(74) *Attorney, Agent, or Firm* — Rothwell, Figg, Ernst & Manbeck, P.C.

(57) ABSTRACT

Disclosed is a plasma processing method including: growing a polycrystalline silicon layer on a processing target base body; and exposing the polycrystalline silicon layer to hydrogen radicals by supplying a processing gas containing hydrogen into a processing container that accommodates the processing target base body including the polycrystalline silicon layer grown thereon and radiating microwaves within the processing container to generate the hydrogen radicals.

10 Claims, 13 Drawing Sheets

(51) Int. Cl.

| | |
|---|---|
| *C23C 16/511* | (2006.01) |
| *C23C 16/455* | (2006.01) |
| *H01J 37/32* | (2006.01) |
| *H01L 21/223* | (2006.01) |
| *C23C 16/52* | (2006.01) |
| *H01L 21/263* | (2006.01) |
| *H01L 21/30* | (2006.01) |
| *H01L 21/67* | (2006.01) |

(52) U.S. Cl.
CPC ............ *C23C 16/511* (2013.01); *C23C 16/52* (2013.01); *H01J 37/3222* (2013.01); *H01J 37/32266* (2013.01); *H01J 37/32357* (2013.01); *H01J 37/32422* (2013.01); *H01J 37/32449* (2013.01); *H01L 21/0245* (2013.01); *H01L 21/0262* (2013.01); *H01L 21/02576* (2013.01); *H01L 21/02595* (2013.01); *H01L 21/02658* (2013.01); *H01L 21/02664* (2013.01); *H01L 21/2236* (2013.01); *H01L 21/263* (2013.01); *H01L 21/3003* (2013.01); *H01L 21/67069* (2013.01); *H01J 2237/334* (2013.01); *H01J 2237/3321* (2013.01)

(56) References Cited

U.S. PATENT DOCUMENTS

2010/0275981 A1\* 11/2010 Ohmi ..................... C23C 16/24
  136/252
2012/0142172 A1\* 6/2012 Fox ......................... C23C 16/24
  438/488

FOREIGN PATENT DOCUMENTS

| JP | 2002-343993 A | 11/2002 |
| JP | 2003-282433 A | 10/2003 |
| JP | 2005-129666 A | 5/2005 |
| JP | 2005-206897 A | 8/2005 |
| JP | 2011-77322 A | 4/2011 |
| WO | 2009/101925 A1 | 8/2009 |

\* cited by examiner (a)

(b)

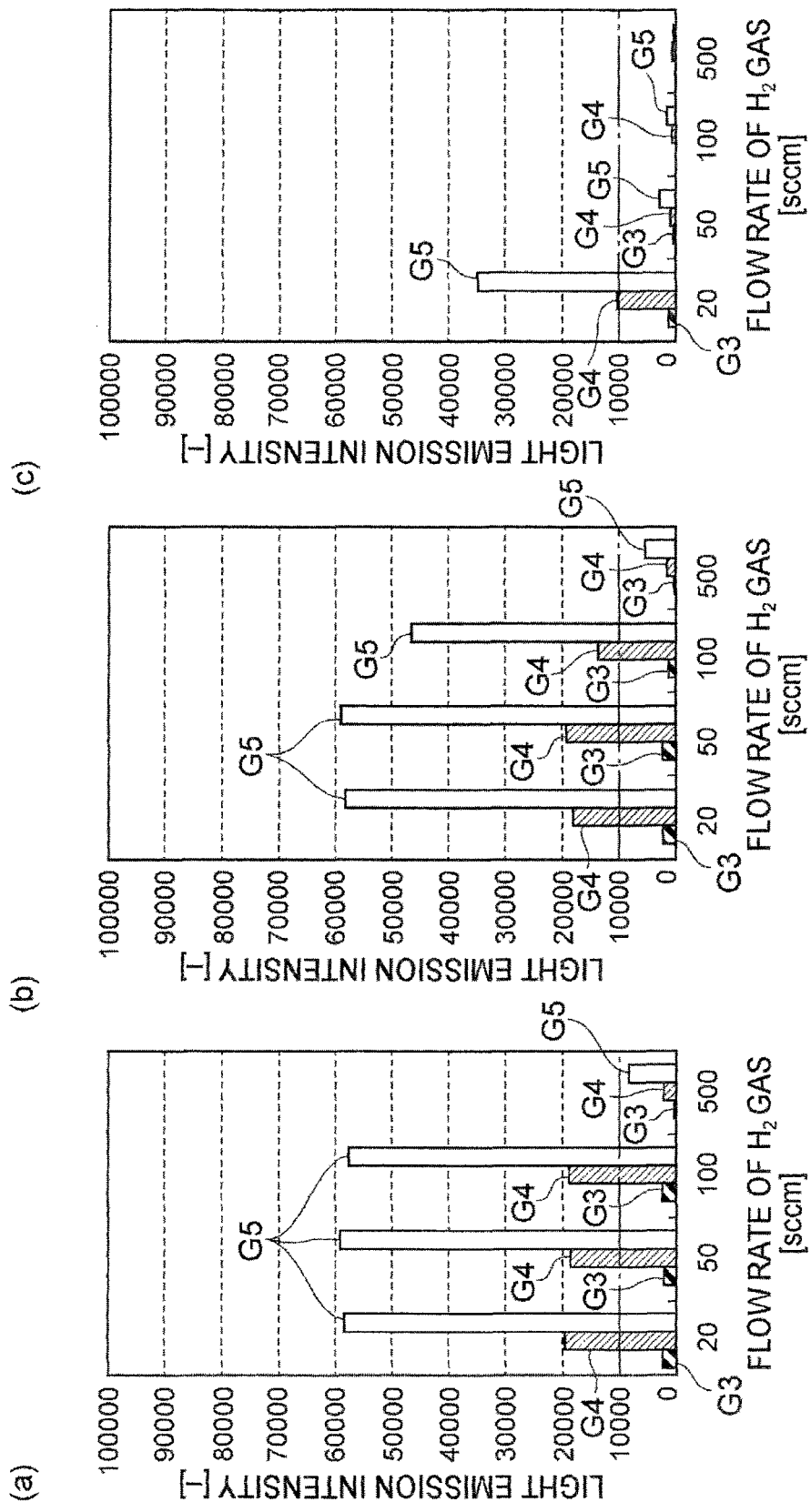

PLASMA PROCESSING METHOD AND PLASMA PROCESSING APPARATUS

CROSS REFERENCE TO RELATED APPLICATION

This application is a 35 U.S.C. 371 National Phase Entry Application from PCT/JP2013/061372, filed Apr. 17, 2013, which claims priority to Japanese Patent Application No. 2012-144368, filed Jun. 27, 2012, the disclosures of which are incorporated herein in their entirety by reference.

TECHNICAL FIELD

Exemplary embodiments of the present disclosure relate to a plasma processing method and a plasma processing apparatus, and in more particular, to a plasma processing method for processing a polycrystalline silicon layer and a plasma processing apparatus which may be used for performing the method.

BACKGROUND

As silicon semiconductors, a single crystalline silicon semiconductor, a polycrystalline silicon semiconductor, and an amorphous silicon semiconductor may be exemplified. Among these various silicon semiconductors, the polycrystalline silicon semiconductor is widely used as a material for a semiconductor element using a silicon semiconductor since the polycrystalline silicon semiconductor is easy to manufacture as compared to the single crystalline silicon semiconductor.

A pin diode is an example of a semiconductor element that uses the polycrystalline silicon semiconductor. The pin diode refers to a semiconductor element having a pin structure in which an i-type (non-doped) polycrystalline silicon layer with a high electric resistance is disposed between a p-type polycrystalline silicon layer and an n-type polycrystalline silicon layer. The pin diode is obtained, for example, by forming a p-type polycrystalline silicon layer doped with boron on a base body including an electrode layer, forming an i-type polycrystalline silicon layer on the p-type polycrystalline silicon layer, and Miming an n-type polycrystalline silicon layer doped with phosphorus on the i-type polycrystalline silicon layer.

There are two methods known for forming a polycrystalline silicon layer. The first method is to grow the polycrystalline silicon layer using a thermal CVD method in which a temperature condition is about 600° C. An example of this method is disclosed as a first exemplary embodiment in Patent Document 1. The second method is to obtain the polycrystalline silicon layer by forming an amorphous silicon layer and applying thermal annealing to the amorphous silicon layer. An example of this method is disclosed as a second exemplary embodiment in Patent Document 1. In addition, Patent Document 2 discloses a method using laser annealing instead of the thermal annealing.

PRIOR ART DOCUMENT

Patent Document

Patent Document 1: Japanese Patent Laid-Open Publication No. 2001-144258
Patent Document 2: Japanese Patent Laid-Open Publication No. 2003-282433

SUMMARY OF THE INVENTION

Problem to be Solved

Thickness reduction of each layer forming a semiconductor element advances progressively. For example, a pin diode requires an n-type or p-type polycrystalline silicon layer having a thickness of 10 nm or less. The thickness of the polycrystalline silicon layer may be affected by the surface roughness of the polycrystalline silicon layer. For example, in a case of a pin diode including a p-type or n-type polycrystalline silicon layer with a thickness of 10 nm or less, when the surface roughness of the polycrystalline silicon layer becomes 1 nm or more as a center line average roughness Ra, the surface roughness cannot be ignored in the thickness distribution of the polycrystalline silicon layer, and may deteriorate the operation of the pin diode in some cases.

However, the surface roughness of the polycrystalline silicon film grown by the CVD method is essentially large. In addition, when the thermal annealing or laser annealing is applied to an amorphous silicon layer which essentially has a small surface roughness, the surface roughness of an obtained polycrystalline silicon layer may increase. Occasionally, a range of annealing conditions, where a polycrystalline silicon layer having a small surface roughness may be obtained by applying the thermal annealing to the amorphous silicon layer, may be too narrow to perform a process control.

Accordingly, what is requested in this technical field is a processing method which is capable of reducing a surface roughness of polycrystalline silicon, and an apparatus which may be used for performing the processing method.

Means to Solve the Problem

A plasma processing method according to an aspect of the present disclosure includes: (a) a step of growing a polycrystalline silicon layer on a processing target base body; and (b) a step of exposing the polycrystalline silicon layer to hydrogen radicals by supplying a processing gas containing hydrogen-containing gas into a processing container that accommodates the processing target base body including the polycrystalline silicon layer grown thereon and radiating microwaves within the processing container to generate the hydrogen radicals.

In the plasma processing method, the surface of the polycrystalline layer is etched very slightly by the hydrogen radicals. By the etching, the surface of the polycrystalline silicon layer is flattened. Thus, according to the present plasma processing method, the surface roughness of the polycrystalline silicon layer may be reduced.

In an exemplary embodiment, the step (b) of exposing the polycrystalline silicon layer to the hydrogen radicals may be performed in the same processing container as the step (a) of growing the polycrystalline silicon layer. According to the present exemplary embodiment, a step of carrying out the processing target base body including the polycrystalline silicon layer grown thereon from the processing container to provide the processing target base body to another processing container is not required. Accordingly, increase of the number of processing steps may be suppressed. In addition, oxidation of the surface of the polycrystalline silicon layer may be prevented.

According to an exemplary embodiment, the method may further include: (c) a step of growing another polycrystalline silicon layer on the polycrystalline silicon layer exposed to the hydrogen radicals. In the present exemplary embodiment, the other polycrystalline silicon layer is formed by using the polycrystalline silicon layer exposed to the hydrogen radicals, that is, the polycrystalline silicon layer with the reduced surface roughness as an underlayer. Thus, according to the present exemplary embodiment, the effect of the surface roughness of the underlayer on the thickness distribution of the other polycrystalline silicon may be reduced.

In an exemplary embodiment, the step (c) of growing another polycrystalline silicon layer may be performed in the same processing container as the step of exposing the polycrystalline silicon layer to the hydrogen radicals. According to the present exemplary embodiment, the another polycrystalline silicon layer is grown on the flattened surface of the polycrystalline silicon layer without exposing the surface-flattened polycrystalline silicon layer to external air. Accordingly, the oxidation of the flattened surface may be suppressed.

In an exemplary embodiment, the step (a) of growing the polycrystalline silicon layer may include: (a1) a step of growing a first polycrystalline silicon layer on the processing target base body by supplying a silicon-containing raw material gas and a first gas containing a first dopant material into the processing container and radiating the microwaves within the processing container; and (a2) a step of growing an i-type polycrystalline silicon layer on the first polycrystalline silicon layer by supplying the raw material gas into the processing container and radiating the microwaves within the processing container. In the step (c) of growing the another polycrystalline silicon layer, a second polycrystalline silicon layer may be grown on the i-type polycrystalline silicon layer by supplying the raw material gas and a second gas containing a second dopant material and radiating the microwaves within the processing container. Here, in a pin diode, the thickness of the i-type polycrystalline silicon layer is generally thicker than that of the p-type or n-type polycrystalline layer. In addition, the surface roughness of a polycrystalline silicon layer increase as the thickness of the polycrystalline silicon layer increases. In the method of the present exemplary embodiment, the surface roughness of the i-type polycrystalline silicon layer is reduced by exposing the i-type polycrystalline silicon layer to the hydrogen radicals. In addition, the second conductive type polycrystalline silicon layer is grown using the i-type polycrystalline silicon layer with the reduced surface roughness as the underlayer. Thus, according to the present exemplary embodiment, the effect of the surface roughness of the underlayer on the thickness distribution of the second conductive type polycrystalline silicon layer may be reduced.

In addition, according to an exemplary embodiment, the method may further include: before the step (a) of growing the polycrystalline silicon layer, (d) a step of exposing the processing target base body to the hydrogen radicals by supplying a processing gas into the processing container and radiating the microwaves within the processing container to generate the hydrogen radicals. The surface of the processing target base body may be a surface of an electrode layer. According to the present exemplary embodiment, the surface roughness of the electrode layer may be reduced by exposing the electrode layer of the underlayer to the hydrogen radicals. As a result, the effect of the surface roughness of the underlayer on the thickness distribution of the polycrystalline silicon layer formed on the electrode layer of the underlayer may be reduced.

In an exemplary embodiment, the microwaves may be radiated into the processing container from a radial line slot antenna. In an exemplary embodiment, the hydrogen-containing gas may be hydrogen gas. According to the present exemplary embodiment, the hydrogen radicals may be efficiently generated.

In an exemplary embodiment, a diluent gas may be further supplied into the processing container together with the processing gas, and a ratio of a flow rate of the hydrogen-containing gas in relation to a flow rate of the diluent gas may be 10% or less. According to the present exemplary embodiment, the generation efficiency of the hydrogen radicals may be enhanced.

In an exemplary embodiment, in the step of exposing the polycrystalline silicon layer to the hydrogen radicals and in the step of exposing the processing target base body to the hydrogen radicals, a pressure within the processing container may be set to be 13 Pa or less. According to the present exemplary embodiment, the generation efficiency of the hydrogen radicals may be further enhanced.

A plasma processing apparatus according to another aspect of the present disclosure is an apparatus for processing a polycrystalline silicon layer. The plasma processing apparatus includes: a processing container configured to accommodate a processing target base body including the polycrystalline silicon layer grown on a principal surface thereof; a processing gas supply unit configured to supply a processing gas including a hydrogen-containing gas; a microwave generator configured to generate microwaves; and an antenna connected to the microwave generator and configured to radiate microwaves for exciting plasma of the processing gas.

The plasma processing apparatus may expose the polycrystalline silicon layer of the processing target base body accommodated in the processing container to hydrogen radicals. Upon being exposed to the hydrogen radicals, the surface of the polycrystalline silicon layer is very slightly etched. By the etching, the surface of the polycrystalline silicon layer is flattened. Thus, according to the plasma processing apparatus, the surface roughness of the polycrystalline silicon layer may be reduced.

In an exemplary embodiment, the plasma processing apparatus may further include: a raw material gas supply unit configured to supply a silicon-containing raw material gas into the processing container; and a control unit configured to control the processing gas supply unit, the raw material gas supply unit, and the microwave generator. The control unit may perform: a first control of causing the raw material gas supply unit to supply a gas including the raw material gas into the processing container and causing the microwave generator to generate microwaves, and a second control of causing the processing gas supply unit to supply the processing gas into the processing container and causing the microwave generator to generate microwaves. When the plasma processing apparatus of the present exemplary embodiment performs the first control, the polycrystalline silicon layer may be grown on the processing target base body accommodated in the processing container. In addition, when the plasma processing apparatus performs the second control, the surface roughness of the polycrystalline silicon layer may be reduced using the hydrogen radicals.

In an exemplary embodiment, the control unit may alternately repeat the first control and the second control. According to the present exemplary embodiment, the surface roughness of the grown polycrystalline silicon layer may be reduced, and another polycrystalline silicon layer may be grown using the polycrystalline silicon with the reduced surface roughness as an underlayer. Thus, according to the present exemplary embodiment, the effect of the surface roughness of the underlayer on the thickness distribution of the another polycrystalline silicon layer may be reduced.

In an exemplary embodiment, the material gas supply unit may further supply a first gas containing a first dopant material and a second gas containing a second dopant material, and the control unit may cause the first gas or the second gas to be selectively supplied into the processing container in addition to the raw material gas in performing the first control multiple times. In the exemplary embodiment, the first conductive type polycrystalline silicon layer or the second conductive type polycrystalline silicon layer may be selectively grown by the first control.

In an exemplary embodiment, the control unit may perform the second control before the polycrystalline silicon layer is formed on the processing target base body. According to the present exemplary embodiment, the surface roughness of the processing target base body which is an underlayer of the polycrystalline silicon layer, for example, the electrode layer, is reduced. Accordingly, the effect of the surface roughness of the underlayer on the thickness distribution of the polycrystalline silicon layer formed on the electrode layer of the underlayer may be reduced.

In an exemplary embodiment, the antenna may be a radial line slot antenna. In addition, in an exemplary embodiment, the hydrogen-containing gas may be hydrogen gas. According to the present exemplary embodiment, the hydrogen radicals may be efficiently generated in the processing container.

In an exemplary embodiment, the plasma processing apparatus may further include: a diluent gas supply unit configured to further supply a diluent gas into the processing container, the processing gas supply unit may include a first flow rate regulation unit configured to regulate a flow rate of the processing gas, and the diluent gas supply unit may include a second flow rate regulation unit configured to regulate a flow rate of the diluent gas. The control unit may set a ratio of the flow rate of the processing gas in relation to the flow rate of the diluent gas to 10% or less in the first flow rate regulation unit and the second flow rate regulation unit. According to the present exemplary embodiment, the generation efficiency of the hydrogen radicals may be enhanced.

In an exemplary embodiment, the plasma processing apparatus may further include: a pressure regulation unit configured to regulate a pressure within the processing container. The control unit may set the pressure within the processing container to 13 Pa or less in the pressure regulation unit. According to the present exemplary embodiment, the generation efficiency of the hydrogen radicals may be further enhanced.

Effect of the Invention

As described above, the present disclosure provides a method which is capable of reducing a surface roughness of polycrystalline silicon and an apparatus which may be used for performing the processing method.

BRIEF DESCRIPTION OF DRAWINGS

FIG. 13 illustrates graphs representing relationships between flow rates of hydrogen gas and argon gas and a generated amount of hydrogen radicals according to Test Example 4.

DETAILED DESCRIPTION TO EXECUTE THE INVENTION

Figure 1:
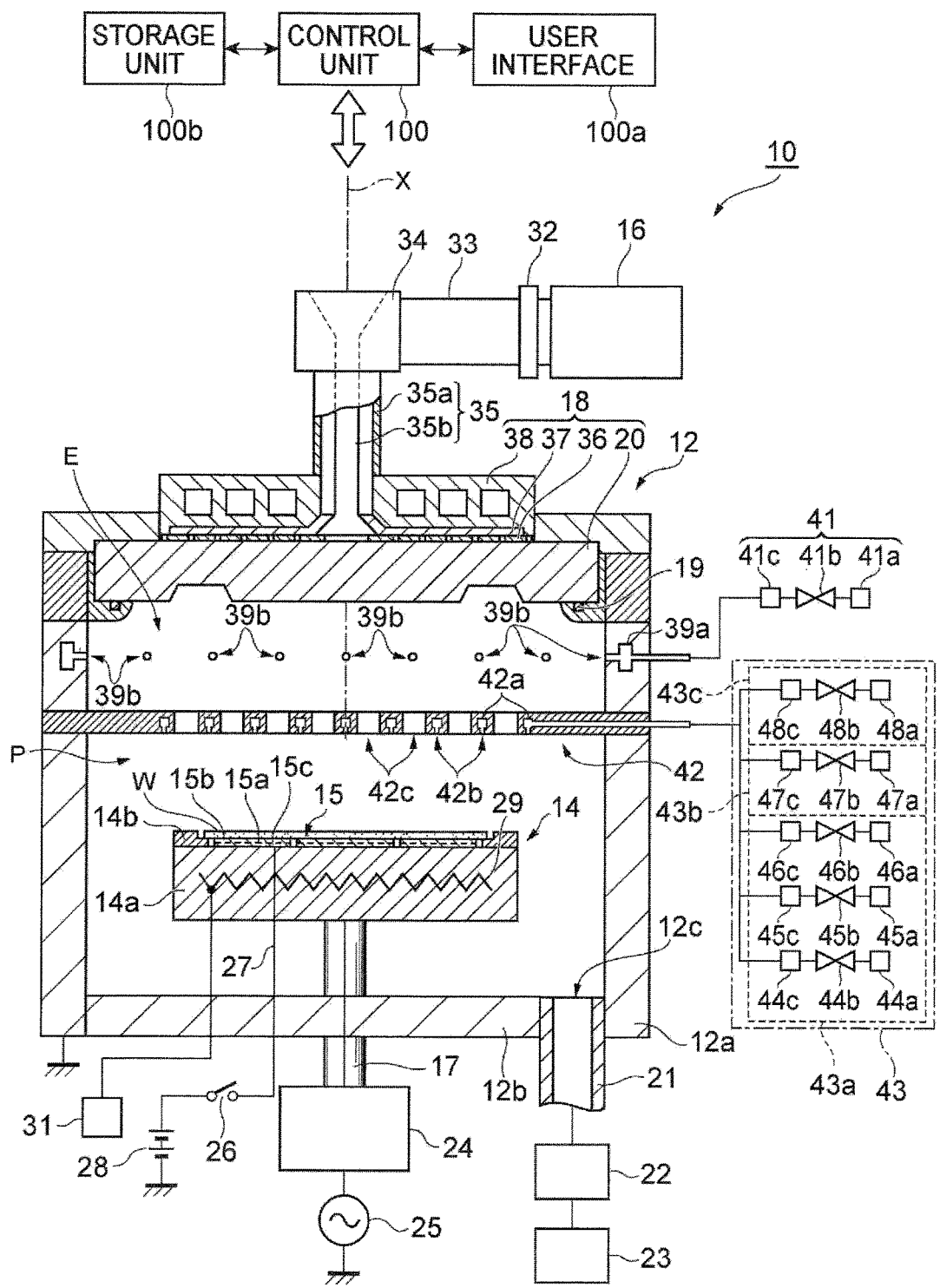
FIG. 1 is a view schematically illustrating a plasma processing apparatus according to an exemplary embodiment.

Hereinafter, various exemplary embodiments will be described in detail with reference to the accompanying drawings. In the drawings, the same or corresponding elements will be denoted by the same symbols.

FIG. 1 is a view schematically illustrating a plasma processing apparatus according to an exemplary embodiment. The plasma processing apparatus 10 illustrated in FIG. 1 excites plasma by microwaves and is provided with a processing container 12, a stage 14, a microwave generator 16, and an antenna 18.

The processing container 12 defines a plasma generation space E for generating plasma, and also defines a processing space P for performing a plasma processing on a processing target base body W below the plasma generation space E. The processing container 12 may include a side wall 12a and a bottom portion 12b. The side wall 12a has a substantially cylindrical shape extending in an axis X direction (i.e., in the extension direction of the axis X). The upper end of the side wall 12a is opened.

The opening in the upper end of the side wall 12a is closed by a dielectric window 20. An O-ring 19 may be interposed between the dielectric window 20 and the upper end of the side wall 12a. The processing container 12 may be more securely sealed by the O-ring 19.

The bottom portion 12b is formed at the lower end side of the side wall 12a. An exhaust pipe 21 including an exhaust hole 12c is installed in the bottom portion 12b. The exhaust pipe 21 is connected to an exhaust apparatus 23 via a pressure regulation unit 22. The pressure regulation unit 22 is controlled by a control unit to be described below to control a flow rate of a discharged gas, thereby regulating the pressure within the processing container 12. The exhaust apparatus 23 includes a vacuum pump such as, for example, a turbo molecular pump. The processing space P within the processing container 12 may be decompressed to a desired vacuum degree by the exhaust apparatus 23.

A stage 14 is installed within the processing container 12. The stage 14 is provided below the processing space P to face a shower plate 42 to be described below. A processing target base body W is mounted on the stage 14. In an exemplary embodiment, the stage 14 may include a table 14a, a focus ring 14b, and an electrostatic chuck 15. Meanwhile, the stage 14 including the table 14a, the focus ring 14b, and the electrostatic chuck 15 constitutes a mounting table according to an exemplary embodiment.

The table 14a is supported by a support 17 extending upwardly from the bottom portion 12b of the processing container 12. The table 14a also serves as a high frequency electrode. A high frequency power supply 25 for RF bias is electrically connected to the table 14a via a matching unit 24. The high frequency power supply 25 outputs a high frequency bias power having a predetermined frequency suitable for controlling the energy of ions drawn into the processing target base body W, for example, 13.65 MHz, with a predetermined power. In an exemplary embodiment, the power of the high frequency bias power may be in a range of 100 W to 500 W. The matching unit 24 accommodates a matcher configured to match a high frequency power supply 25 side impedance and a load side impedance such as, for example, an electrode, plasma, and the processing container 12. A blocking capacitor for self-bias generation is included in the matcher.

An electrostatic chuck 15 serving as a holding member for holding the processing target base body W is provided on the top surface of the table 14a. The electrostatic chuck 15 holds the processing target base body W using an electrostatic attraction force. A focus ring 14b is installed radially outside of the electrostatic chuck 15 to annularly surround the periphery of the processing target base body W and the periphery of the electrostatic chuck 15.

The electrostatic chuck 15 includes an electrode 15a, an insulation film 15b, and an insulation film 15c. The electrode 15a is formed of a conductive film and provided between the insulation film 15b and the insulation film 15c. A direct current ("DC") power supply 28 with a high voltage is electrically connected to the electrode 15a via a switch 26 and a coated wire 27. The electrostatic chuck 15 is capable of holding the processing target base body W by a Coulomb force generated by the DC voltage applied from the DC power supply 28.

A heater 29 is installed inside of the table 14a. The heater 29 is connected to a heater power supply 31 and generates heat by the power supplied from the heater power supply 31 so as to heat the processing target base body W.

The microwave generator 16 generates microwaves of, for example, 2.45 GHz. In an exemplary embodiment, the plasma processing apparatus 10 may further include a tuner 32, a waveguide 33, a mode converter 34, and a coaxial waveguide 35.

The microwave generator 16 is connected to the waveguide 33 via the tuner 32. The waveguide 33 is, for example, a rectangular waveguide. The waveguide 33 is connected to the mode converter 34, and the mode converter 34 is connected to the upper end of the coaxial waveguide 35.

The coaxial waveguide 35 extends along the axis X. The coaxial waveguide 35 includes an outer conductor 35a and an inner conductor 35b. The outer conductor 35a has a substantially cylindrical shape extending in the axis X direction. The inner conductor 35b is provided within the outer conductor 35a. The inner conductor 35b has a substantially cylindrical shape extending along the axis X.

The microwaves generated by the microwave generator 16 are guided to the mode converter 34 though the tuner 32 and the waveguide 33. The mode converter 34 converts the mode of the microwaves and supplies the mode-converted microwaves to the coaxial waveguide 35. The microwaves from the coaxial waveguide 35 are supplied to an antenna 18.

Based on the microwaves generated by the microwave generator 16, the antenna 18 radiates microwaves for plasma excitation to the plasma generation space E. The antenna 18 may include a dielectric window 20, a slot plate 36, a dielectric plate 37, and a cooling jacket 38. The microwaves from the coaxial waveguide 35 are propagated to the dielectric plate 37, and radiated to the plasma generation space E from the slots of the slot plate 36 through the dielectric window 20.

The dielectric window 20 has a substantially disc shape and is formed of, for example, quartz. The dielectric window 20 is installed just below the slot plate 36 in the axis X direction.

Figure 2:
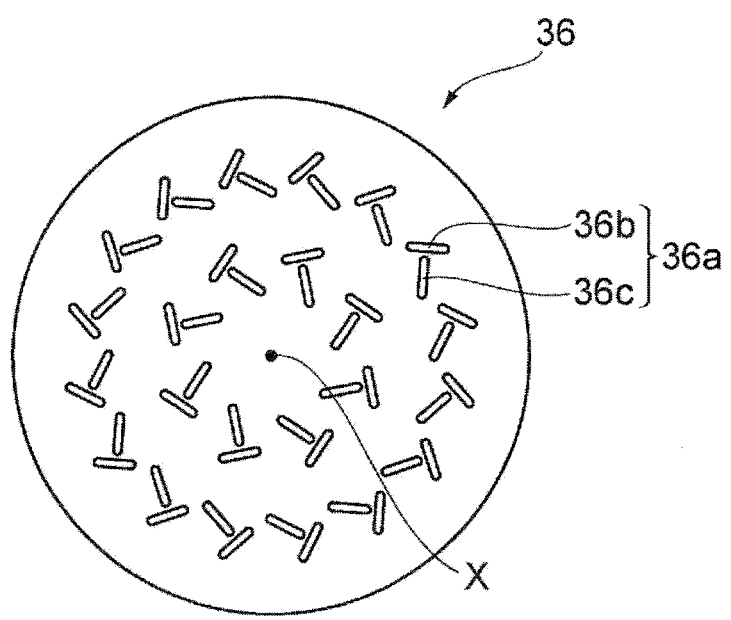
FIG. 2 is a plan view illustrating a slot plate according to an exemplary embodiment which is viewed in an axis X direction.

FIG. 2 is a plan view of a slot plate 36 according to an exemplary embodiment which is viewed in the axis X direction. As illustrated in FIG. 2, the slot plate 36 includes a plurality of slot pairs which is arranged in a circumferential direction around the axis X. In an exemplary embodiment, the slot plate 36 may be a slot plate that forms a radial line slot antenna. The slot plate 36 is formed of a conductive metal in a disc shape. The slot plate 36 includes a plurality of slot pairs 36a formed therein. Each slot pair 36a includes a slot 36b and a slot 36c which intersect with each other or extend in orthogonal directions. The plurality of slot pairs 36a is arranged at predetermined intervals in the radial direction as well as in the circumferential direction.

As illustrated in FIG. 1, the dielectric plate 37 is installed between the slot plate 36 and the bottom surface of the cooling jacket 38. The dielectric plate 37 is made of, for example, quartz in a substantially disc shape. The surface of the cooling jacket 38 may be conductive. The cooling jacket 38 cools the dielectric plate 37 and the slot plate 36. Therefore, a coolant flow path is formed within the cooling jacket 38. The lower end of the outer conductor 35a is electrically connected to the top surface of the cooling jacket 38. In addition, the lower end of the inner conductor 35b is electrically connected to the slot plate 36 through a hole formed in the central portions of the cooling jacket 38 and the dielectric plate 37.

In an exemplary embodiment, a gas flow path 39a and a plurality of injection holes 39b are formed in the side wall 12a of the processing container 12. The gas flow path 39a extends annularly around the axis X and is connected to a gas supply unit 41. The gas supply unit 41 supplies a gas for plasma generation to the gas flow path 39a. The gas for plasma generation supplied by the gas supply unit 41 is, for example, Ar gas or $H_2$ gas. The gas supply unit 41 may include a gas source 41a, a valve 41b, and a flow rate controller 41c. The gas source 41a is the gas source of the gas for plasma generation. The valve 41b switches supply of the gas from the gas source 41a and stop of the supply. The flow rate controller 41c is, for example, a mass flow controller and regulates the flow rate of the gas from the gas source 41a. The plurality of injection holes 39b is connected to the gas flow path 39a that receives the gas for plasma generation from the gas supply unit 41. The plurality of injection holes 39b is arranged annularly around the axis X. The plurality of injection holes 39b injects the gas for plasma generation into the plasma generation space E and injects the gas toward the axis X.

In an exemplary embodiment, the plasma processing apparatus 10 may further include a shower plate 42. The shower plate 42 is interposed between the plasma generation space E and the processing space P and introduces a processing gas including a film forming gas and a hydrogen-containing gas into the processing space P. The shower plate 42 is formed in a grid shape and a gas flow path 42a is formed within the grid. That is, the shower plate 42 includes a gas flow path 42a formed therein and extending in a grid shape. The gas flow path 42a of the shower plate 42 is connected to a gas supply unit 43.

The gas supply unit 43 supplies a film forming gas, a processing gas for processing a polycrystalline silicon layer, and a diluent gas to the gas flow path 42a. In an exemplary embodiment, the gas supply unit 43 includes a raw material gas supply unit 43a, a processing gas supply unit 43b, and a diluent gas supply unit 43c. The raw material gas supply unit 43a includes a plurality of gas sources 44a, 45a, and 46a, a plurality of valves 44b, 45b, and 46b which is connected to the gas sources 44a, 45a 46a, respectively, and a plurality of flow rate controllers 44c, 45c, and 46c which is connected to the valves 44b, 45b, and 46b, respectively.

The gas source 44a is a gas source for a raw material gas for forming the polycrystalline silicon layer. The raw material gas includes Si as a raw material and may be, for example, $SiH_4$ gas. The gas source 44a is connected to the gas flow path 42a via the valve 44b and the flow rate controller 44c. The gas source 45a is a gas source of a first gas. The first gas may be, for example, $B_2H_6$ gas including boron (B) which is a first dopant material. The gas source 45a is connected to the gas flow path 42a via the valve 45b and the flow rate controller 45c. The gas source 46a is a gas source of a second gas. The second gas may be, for example, $PH_3$ gas including phosphorus (P) which is a second dopant material. The gas source 46a is connected to the gas flow path 42a via the valve 46b and the flow rate controller 46c.

The processing gas supply unit 43b includes a gas source 47a, a valve 47b connected to the gas source 47a, and a flow rate controller (first flow rate regulation unit) 47c connected to the valve 47b. The gas source 47a is a gas source of a processing gas. The processing gas is a hydrogen-containing gas for generating hydrogen radicals, and may be, for example, $H_2$ gas. The gas source 47a is connected to the gas flow path 42a via the valve 47b and the flow rate controller 47c. Meanwhile, in an exemplary embodiment, the processing gas that is $H_2$ gas may also be used as the diluent gas when growing the polycrystalline silicon layer.

The diluent gas supply unit 43c includes a gas source 48a, a valve 48b connected to the gas source 48a, and a flow rate controller (second flow rate regulation unit) 48c connected to the valve 48b. The gas source 48a is a gas source of a diluent gas. The diluent gas is an inert gas such as, for example, a rare gas, and may be, for example, argon (Ar) gas. The gas source 48a is connected to the gas flow path 42a via the valve 48b and the flow rate controller 48c. Meanwhile, the diluent gas which is Ar gas in an exemplary embodiment may also be used as a diluent gas when processing the polycrystalline silicon layer. In addition, the diluent gas which is Ar gas in an exemplary embodiment may also be used as another diluent gas together with $H_2$ gas supplied from the processing gas supply unit 43b when growing the polycrystalline silicon layer.

The shower plate 42 connected to the gas supply unit 43 includes a plurality of injection holes 42b formed therein and connected to the gas flow path 42a. The plurality of injection holes 42b injects the processing gas supplied to the gas flow path 42a downwardly to supply the processing gas into the processing space P. Meanwhile, the shower plate 42 and the gas supply unit 43 constitute a gas introduction unit according to an exemplary embodiment.

In addition, the shower plate 42 formed in the grid shape defines a plurality of holes 42c, through which the plasma generation space E and the processing space P communicate with each other. The gas turned into plasma in the plasma generation space E is supplied to the processing space P through the plurality of holes 42c and activates the processing gas for film formation in the processing space P.

In an exemplary embodiment, the plasma processing apparatus 10 may be further provided with a control unit 100 including a programmable microprocessor (computer). The control unit 100 may control respective components of the plasma processing apparatus 10, for example, the high frequency power supply 25, the gas supply units 41 and 43, and the pressure regulation unit 22. In addition, the plasma processing apparatus 10 may be further provided with a user interface 100a connected to the control unit 100. The user interface 100a includes, for example, a keyboard, on which an operator performs, for example, a command input operation in order to manage the plasma processing apparatus 10, or a display configured to visualize and display a working situation of the plasma processing apparatus 10.

In addition, the control unit 100 is connected with a storage unit 100b in which control programs for implementing various processings performed in the plasma processing apparatus 10 under a control of the control unit 100, or programs for causing respective components of the plasma processing apparatus 10 to execute processings according to processing conditions, that is, processing recipes, are stored. The processing recipes are stored in a storage medium in the storage unit 100b. The storage medium may be a hard disc or a semiconductor memory, or a portable medium such as, for example, a CD ROM, a DVD, or a flash memory. In addition, the processing recipes may be properly transmitted from another apparatus through, for example, a dedicated line.

In addition, when an optional processing recipe may be called from the storage unit 100b with, for example, an instruction from the user interface 100a to be executed in the control unit 100 as necessary, a desired processing in the plasma processing apparatus 10 is performed under the control of the control unit 100.

In the plasma processing apparatus 10, the processing gas is supplied to the processing space P from the gas source 47a. Then, the processing gas is turned into plasma by the plasma supplied from the plasma generation space E to the processing space P so that hydrogen radicals are generated. Thus, the polycrystalline silicon layer is exposed to the hydrogen radicals generated in the processing space P so that its surface is etched very slightly. As a result, the surface of the polycrystalline silicon layer is flattened. Accordingly, with the plasma processing apparatus 10, the surface roughness of the polycrystalline silicon layer may be reduced.

In an exemplary embodiment, the control unit 100 performs a control for alternately repeating the first control and the second control in the plasma processing apparatus 10. In the first control, the control unit 100 causes the raw material gas supply unit 43a to supply the raw material gas, and causes the microwave generator 16 to generate microwaves. By the first control, a polycrystalline silicon layer is grown.

In addition, in the second control, the control unit 100 causes the processing gas supply unit 43b to supply a hydrogen-containing processing gas, and causes the microwave generator 16 to generate microwaves. By the second control, the surface of the polycrystalline silicon layer is flattened. Then, when the control unit 100 performs the first control again, another polycrystalline silicon layer is grown on an underlayer with a reduced surface roughness. Accordingly, the effect of the surface roughness of the underlayer on the thickness distribution of the polycrystalline silicon layer is reduced. Meanwhile, the supply of each of the gases from the gas sources 44a to 48a may be regulated by a control of the control unit 100 which is performed with respect to the valves 44b to 48b and the flow rate controllers 44c to 48c.

In addition, in an exemplary embodiment, the raw material gas supply unit 43a of the plasma processing apparatus 10 may further supply the first gas containing the first dopant material and the second gas containing the second dopant material. In the present exemplary embodiment, while performing the first control multiple times, the control unit 100 may cause the raw material gas supply unit 43a to selectively supply the first gas or the second gas into the processing container 12 in addition to the raw material gas. In addition, as described above, the plasma processing apparatus 10 of the present exemplary embodiment may excite plasma with a low electron temperature by the microwaves emitted from the radial line slot antenna. Accordingly, the polycrystalline silicon layer may be grown in a state where impurity atoms are incorporated in the grid structure. Thus, the plasma processing apparatus 10 is capable of growing an activated first conductive type polycrystalline silicon layer and a second conductive type silicon layer. As described above, the plasma processing apparatus 10 of the present exemplary embodiment is capable of manufacturing a pin type diode.

In addition, the control unit 100 of the plasma processing apparatus 10 may perform the second control before forming the polycrystalline silicon layer on the processing target base body W. Here, the surface of the processing target base body W is, for example, an electrode layer of the pin type diode. Since the surface of the processing target base body which serves as an underlayer before the growth of a polycrystalline silicon layer, i.e. the surface of the electrode layer, is flattened, a polycrystalline silicon layer, on which the effect of the surface roughness of the underlayer is suppressed, may be obtained.

Further, as described above, the plasma processing apparatus 10 may use hydrogen gas as the hydrogen-containing processing gas. When the hydrogen gas is used as a processing gas, hydrogen radicals may be efficiently generated in the processing container 12.

In an exemplary embodiment, the plasma processing apparatus 10 may set a ratio of the flow rate of $H_2$ gas in relation to the flow rate of Ar gas to 10% or less by controlling the flow rate controllers 47c and 48c by the control unit 100. When the flow rate of $H_2$ gas and the flow rate of Ar gas are set to be a ratio in this range, the generation efficiency of hydrogen radicals may be enhanced.

Further, in an exemplary embodiment, the plasma processing apparatus 10 may set the pressure within the processing container 12 to be 13 Pa or less by controlling the pressure regulation unit 22 by the control unit 100. When the pressure within the processing container 12 is set to be in this range, the generation efficiency of hydrogen radicals may be further enhanced.

Figure 3:
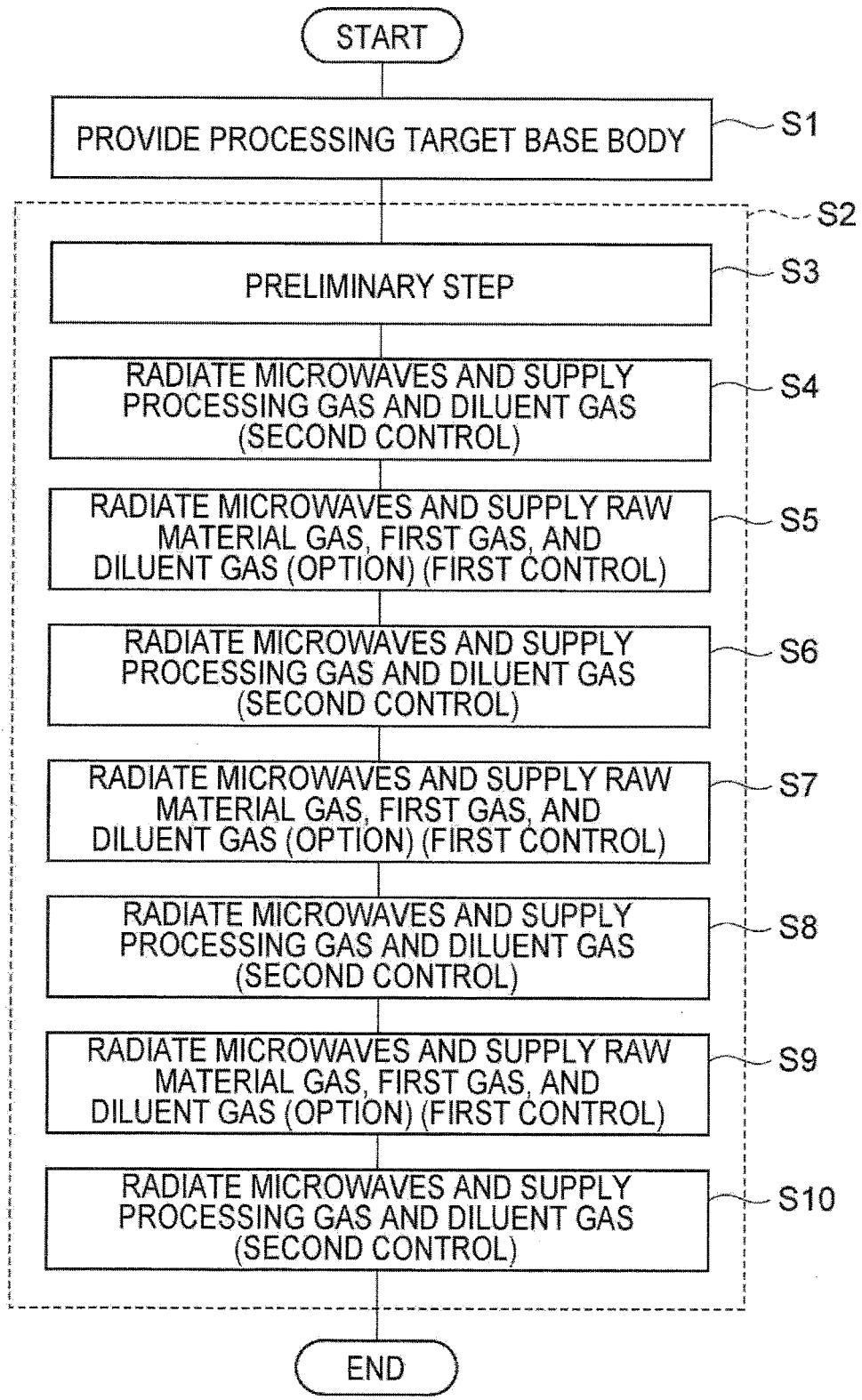
FIG. 3 is a flowchart illustrating a plasma processing method according to an exemplary embodiment.
Figure 4:
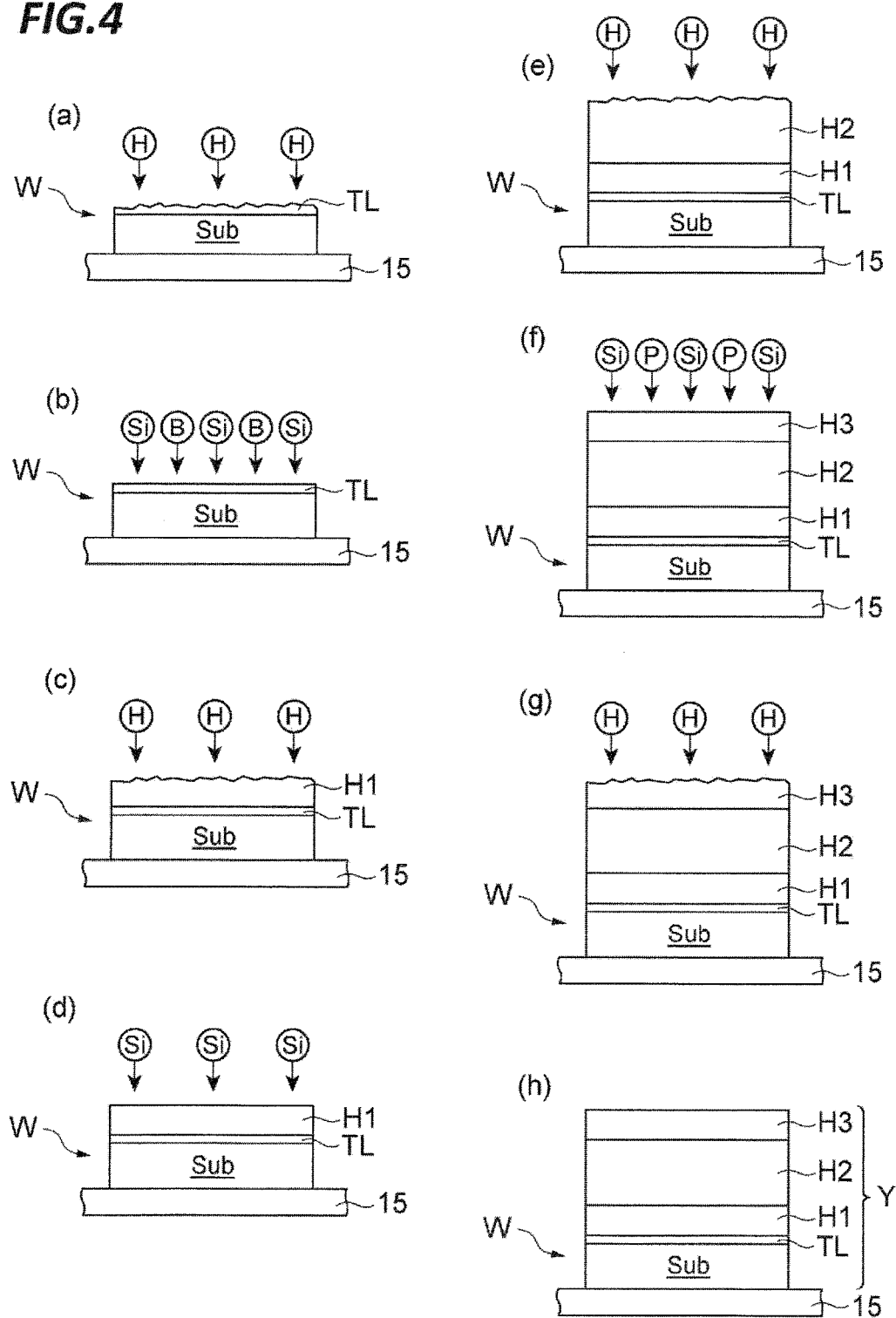
FIG. 4 schematically illustrates a principle of the plasma processing method according to the exemplary embodiment.
Figure 5:
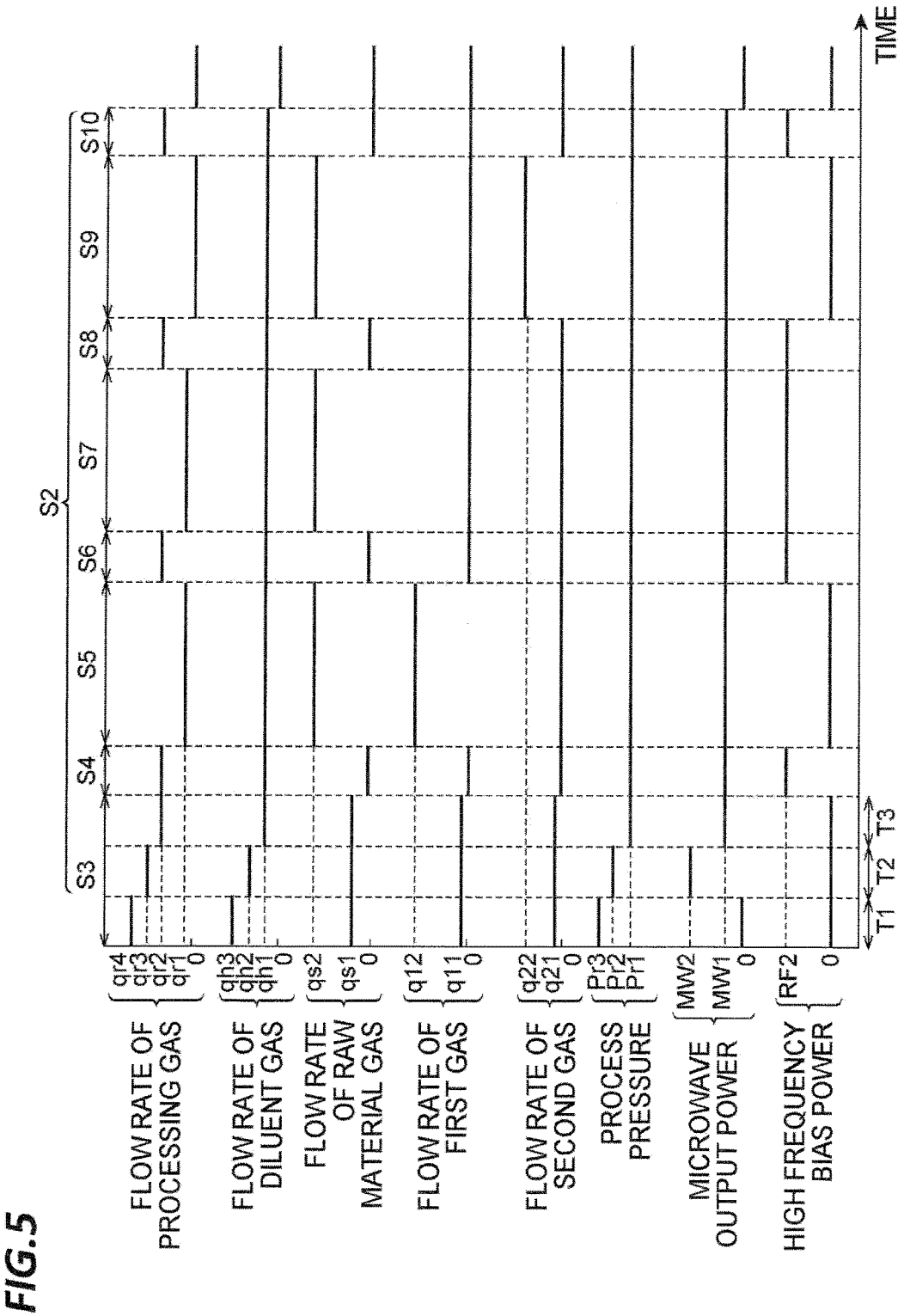
FIG. 5 is a timing chart for describing each step of the plasma processing method according to the exemplary embodiment.

Hereinafter, an exemplary embodiment of a plasma processing method using the plasma processing apparatus 10 of FIG. 1 will be described. FIG. 3 is a flowchart illustrating a plasma processing method according to an exemplary embodiment. FIG. 4 schematically illustrates a film-forming principle in the plasma processing method according to the present exemplary embodiment. FIG. 5 is a timing chart for describing respective steps of the plasma processing method according to the exemplary embodiment.

In the plasma processing method, as illustrated in FIGS. 3 and 4, a semiconductor substrate, which is a processing target base body W, is provided (step S1). In an exemplary embodiment, the processing target base body W may include an electrode layer TL provided on a substrate Sub. In step S1, the semiconductor substrate Sub is introduced into the processing container 12, mounted on the stage 14, and attracted by the electrostatic chuck 15.

Next, in an exemplary embodiment, a film-forming process is performed in step S2. In the present exemplary embodiment, the film-forming process includes steps S3 to S10 to be described below, that is, a preliminary step which is a part of the film-forming process, a step of processing the processing target base body W and a polycrystalline silicon layer, and a step of growing a polycrystalline silicon layer.

In step S3, the preliminary step which is a part of the film-forming process is performed. Specifically, as illustrated in FIG. 5, during a period T1 in step S3, the inside of the processing container 12 is evacuated by the exhaust apparatus 23, a processing gas, for example, $H_2$ gas, is supplied to the processing space P from the gas source 47a at a flow rate qr4, a diluent gas, for example, Ar gas, is supplied to the processing space P from the gas source 48a at a flow rate qh3, and the pressure within the processing container 12 is set to a pressure Pr3. In addition, during the period T1, electric power is applied to the heater 29 to start heating of the stage 14. In addition, during the period T1, a gas for plasma generation, for example, Ar gas, is introduced into the plasma generation space E from the gas source 41a.

Subsequently, during a period T2, the inside of the processing container 12 is evacuated by the exhaust apparatus 23, the processing gas is supplied to the processing space P from the gas source 47a at a flow rate qr3 which is smaller than the flow rate qr4, the diluent gas is supplied to the processing space P from the gas source 48a at a flow rate qh2 which is smaller than the flow rate qh3, and the pressure Pr3 within the processing container 12 is reduced to a pressure Pr2 which is lower than the pressure Pr3. In addition, during the period T2, the gas for plasma generation is introduced into the plasma generation space E from the gas source 41a, microwaves having an output power MW2 are generated by the microwave generator 16, and microwaves for plasma excitation are introduced into the plasma generation space E. As a result, the plasma is ignited in the plasma generation space E.

Subsequently, during a period T3, the inside of the processing container 12 is evacuated by the exhaust apparatus 23, the processing gas is supplied to the processing space P from the gas source 47a at a flow rate qr2 which is smaller than the flow rate qr3, the diluent gas is supplied to the processing space P from the gas source 48a at a flow rate qh1 which is smaller than the qh2, and the pressure within the processing container 12 is reduced to a pressure Pr1 which is lower than the pressure Pr2. In addition, during the period T3, the gas for plasma generation is introduced into the plasma generation space E from the gas source 41a, microwaves having an output power MW1 which is lower than the output power MW2 are generated by the microwave generator 16, and microwaves for plasma excitation are introduced into the plasma generation space E.

Meanwhile, during the periods T1 to T3 in step S3, the flow rate of the diluent gas, the flow rate of the raw material gas, the flow rate of the first gas or the flow rate of the second gas, and the pressure within the processing container 12 may be set to be the same as those in steps S5, S7 and S9 below. In addition, during the period T2 and T3, the microwave output power generated by the microwave generator 16 may be set to be the same as that in steps S5, S7 and S9.

In the plasma processing method of the exemplary embodiment, after the preliminary step in step S3 is terminated, the polycrystalline silicon layer is formed. In an exemplary embodiment, the step of forming the polycrystalline silicon layer includes step S4 for processing the processing target base body W, step S5 for growing a p-type polycrystalline silicon layer which is a first conductive type polycrystalline silicon layer, step S6 for processing the p-type polycrystalline silicon layer grown in step S5, step S7 for growing an i-type polycrystalline silicon layer, step S8 for processing the i-type polycrystalline silicon layer grown in step S6, step S9 for growing an n-type polycrystalline silicon layer which is a second conductive type polycrystalline silicon layer, and step S10 for processing the n-type polycrystalline silicon layer grown in step S9.

In step S4, the control unit 100 performs the second control so as to cause the gas source 47a to supply a processing gas into the processing container 12 and cause the microwave generator 16 to generate microwaves. More specifically, in step S4, the supply of the raw material gas from the gas source 44a is stopped, the supply of the first gas from the gas source 45a is stopped, the supply of the second gas from the gas source 46a is stopped, the inside of the processing container 12 is evacuated by the exhaust apparatus 23, the processing gas is supplied to the processing space P from the gas source 47a at the flow rate qr2, the diluent gas is supplied to the processing space P from the gas source 48a at the flow rate qh1, and the pressure within the processing container 12 is maintained at the pressure Pr1.

In step S4, the flow rate of the processing gas is, for example, 10 sccm to 100 sccm, and the flow rate of the diluent gas is, for example, 100 sccm to 1000 sccm. In step S4, the ratio of the flow rate qr2 of the processing gas in relation to the flow rate qh1 of the diluent gas is 10% or less. In addition, the pressure within the processing container 12 is 13 Pa or less. In addition, in step S4, the gas for plasma generation is introduced into the plasma generation space E from the gas source 41a, and the microwave output power of the microwaves generated by the microwave generator 16 is maintained at the output power MW1. The microwave output power in step S4 is, for example, 2000 W to 4000 W. In addition, in step S4, a high frequency bias power RF2 may be applied to the high frequency electrode from the high frequency power supply 25. In an exemplary embodiment, the diluent gas supplied to the processing space P in step S4 is, for example, Ar gas.

In step S4 described above, the plasma is excited in the plasma generation space E, the plasma is supplied to the processing space P, and the processing gas is activated in the processing space P. As a result, as illustrated in FIG. 4(a), hydrogen radicals ("H" encircled by a circle), which are active species of hydrogen, are generated. The generated hydrogen radicals react with the surface of the semiconductor substrate Sub, that is, the surface of the electrode layer TL and etch the surface of the electrode layer TL to reduce the unevenness of the surface. Accordingly, in step S4, the surface roughness of the electrode layer TL which serves as an underlayer for film-forming in the following step S5 may be reduced.

In the following step S5, the control unit 100 performs the first control to cause the gas source 44a to supply the raw material gas into the processing container 12, cause the gas source 45a to supply the first gas to the processing container 12, and cause the microwave generator 16 to generate microwaves. More specifically, in step S5, the inside of the processing container 12 is evacuated by the exhaust apparatus 23, the processing gas is supplied to the processing space P from the gas source 47a at a flow rate qr1 which is smaller than the flow rate qr2, the diluent gas is supplied to the processing space P from the gas source 48a at the flow rate qh1, the raw material gas from the gas source 44a is supplied to the processing space P at the flow rate qs2, the first gas from the gas source 45a is supplied to the processing space P at the flow rate q12, and the pressure within the processing container 12 is maintained at the pressure Pr1. The flow rate of the processing gas is, for example, 0 sccm to 1000 sccm, and the flow rate of the diluent gas is, for example, 0 sccm to 1000 sccm. The flow rate of the raw material gas is, for example, 1 sccm to 100 sccm, and the flow rate of the first gas is, for example, 0.02 sccm to 2 sccm.

In addition, in step S5, the gas for plasma generation is introduced into the plasma generation space E from the gas source 41a, and the microwave output power of the microwaves generated by the microwave generator 16 is maintained at the output power MW1. The microwave output power in step S5 is, for example, 2000 W to 4000 W. In addition, in an exemplary embodiment, in step S5, the diluent gas supplied to the processing space P is a mixed gas of $H_2$ gas supplied from the gas source 47a and Ar gas supplied from the gas source 48a. That is, the processing gas in step S4 may be used as the diluent gas in step S5. Further, in an exemplary embodiment, in step S5, a bias power may be applied to the high frequency electrode from the high frequency power supply 25 in which the bias power may be in a range of 100 W to 500 W.

In step S5, the plasma is excited in the plasma generation space E, the plasma is supplied to the processing space P, and the raw material gas and the first gas are activated in the processing space P. As a result, as illustrated in FIG. 4(b), the active species of silicon ("Si" encircled by a circle in the drawing) and the active species of the first dopant material ("B" encircled by a circle in the drawing) react with the surface of the semiconductor substrate Sub so that a p-type polycrystalline silicon layer H1 is grown on the flattened semiconductor substrate Sub. The p-type polycrystalline silicon layer H1 grown in step S5 has a thickness of, for example, 3 nm to 50 nm.

In the next step S6, the control unit 100 performs the second control again. More specifically, in step S6, the supply of the raw material gas from the gas source 44a and the supply of the first gas from the gas source 45a are stopped, the inside of the processing container 12 is evacuated by the exhaust apparatus 23, the processing gas is supplied to the processing space P from the gas source 47a at the flow rate qr2, the diluent gas is supplied to the processing space P from the gas source 48a at the flow rate qh1, and the pressure within the processing container 12 is maintained at the pressure Pr1.

In step S6, the flow rate of the processing gas is, for example, 10 sccm to 100 sccm, and the flow rate of the diluent gas is, for example, 100 sccm to 1000 sccm. In step S6, the ratio of the flow rate qr2 of the processing gas in relation to the flow rate qh1 of the diluent gas is 10% or less. In addition, the pressure within processing container 12 is 13 Pa or less. In addition, in step S6, the gas for plasma generation is introduced into the plasma generation space E from the gas source 41a, and the microwave output power of the microwaves of the microwave generator 16 is maintained at the output power MW1. The microwave output power in step S6 is, for example, 2000 W to 4000 W. In addition, in step S6, a high frequency bias power RF2 is applied to the high frequency electrode from the high frequency power supply 25. In an exemplary embodiment, the diluent gas supplied to the processing space P in step S6 is, for example, Ar gas. In an exemplary embodiment, in step S6, the bias power may be applied to the high frequency electrode from the high frequency power supply 25 in which the bias power may be a power of 500 W or less.

In step S6, the plasma is excited in the plasma generation space E, the plasma is supplied to the processing space P, and the processing gas is activated in the processing space P. As a result, as illustrated in FIG. 4(c), hydrogen radicals ("H" encircled by a circle in the drawing) which are active species of hydrogen are generated. The generated hydrogen radicals react with the surface of the p-type polycrystalline silicon layer H1 and etch the surface of the p-type polycrystalline silicon layer H1 to reduce the unevenness of the surface. Accordingly, in step S6, the surface roughness of the p-type polycrystalline silicon layer H1 which serves as the underlayer for film-forming in the following step S7 may be reduced.

In the next step S7, the control unit 100 performs the first control to cause the gas source 44a to supply the raw material gas into the processing container 12, and cause the microwave generator to generate microwaves. More specifically, in step S7, the inside of the processing container 12 is evacuated by the exhaust apparatus 23, the processing gas is supplied to the processing space P from the gas source 47a at the flow rate qr1, the diluent gas is supplied to the processing space P from the gas source 48a at the flow rate qh1, and the raw material gas from the gas source 44a is supplied to the processing space P at the flow rate qs2, and the pressure within the processing container 12 is maintained at the pressure Pr1.

The flow rate of the raw material gas is, for example, 1 sccm to 100 sccm. In addition, in step S7, the gas for plasma generation is introduced into the plasma generation space E from the gas source 41a, and the microwave output power of the microwaves generated by the microwave generator 16 is maintained at the output power MW1. The microwave output power in step S7 is, for example, 2000 W to 4000 W. In addition, in step S7, the high frequency bias power RF2 is applied to the high frequency electrode from the high frequency power supply 25. The high frequency bias power in step S7 is, for example, 100 W to 500 W. In addition, in an exemplary embodiment, the diluent gas supplied to the processing space P in step S7 is Ar gas.

In step S7 described above, the plasma is excited in the plasma generation space E, the plasma is supplied to the processing space P, and the raw material gas is activated in the processing space P. As a result, as illustrated in FIG. 4(d), the active species of silicon ("Si" encircled by a circle in the drawing) react with the surface of the p-type polycrystalline silicon layer H1 so that i-type polycrystalline silicon layer H2 is grown on the flattened p-type polycrystalline silicon layer H1. The i-type polycrystalline silicon layer H2 grown in step S7 has a thickness of, for example, 40 nm to 100 nm.

In the next step S8, the control unit 100 performs the second control again. More specifically, the supply of the raw material gas from the gas source 44a is stopped, the inside of the processing container 12 is evacuated by the exhaust apparatus 23, the processing gas is supplied to the processing space P from the gas source 47a at the flow rate qr2, the diluent gas is supplied to the processing space P from the gas source 48a at the flow rate qh1, and the pressure within the processing container 12 is maintained at the pressure Pr1. The flow rate of the processing gas is, for example, 10 sccm to 100 sccm, and the flow rate of the diluent gas is, for example, 100 sccm to 1000 sccm. In step S8, the ratio of the flow rate qr2 of the processing gas in relation to the flow rate qh1 of the diluent gas is 10% or less. In addition, the pressure within the processing container 12 is 13 Pa or less. In addition, in step S8, the gas for plasma generation is introduced into the plasma generation space E from the gas source 41a and the microwave output power of the microwaves generated by the microwave generator 16 is maintained at the output power MW1. The microwave output power in step S8 is, for example, 2000 W to 4000 W. In step S8, the high frequency bias power RF2 is applied to the high frequency electrode from the high frequency power supply 25. In an exemplary embodiment, the diluent gas supplied to the processing space P in step S8 is, for example, Ar gas.

In step S8, the plasma is excited in the plasma generation space E, the plasma is supplied to the processing space P, and the processing gas is activated in the processing space P. As a result, as illustrated in FIG. 4(e), hydrogen radicals ("H" encircled by a circle in the drawing), which are active species of hydrogen, are generated. The generated hydrogen radicals react with the surface of the i-type polycrystalline silicon layer H2 and etch the surface of the i-type polycrystalline silicon layer H2 to reduce the unevenness thereof. Accordingly, in step S8, the surface roughness of the i-type polycrystalline silicon layer H2 which serves as an underlayer in the following step S9 may be reduced.

In the following step S9, the control unit 100 performs the first control to cause the gas source 44a to supply the raw material gas into the processing container 12, the gas source 46a to supply the second gas into the processing container 12, and the microwave generator 16 to generate microwaves. More specifically, the inside of the processing container 12 is evacuated by the exhaust apparatus 23, the processing gas is supplied to the processing space P from the gas source 47a at the flow rate qr1, the diluent gas is supplied to the processing space P from the gas source 48a at the flow rate qh1, the raw material gas from the gas source 44a is supplied to the processing space P at the flow rate qs2, the second gas from the gas source 46a is supplied to the processing space P at the flow rate q22, and the pressure within the processing container 12 is maintained at the pressure Pr1. The flow rate of the raw material gas is, for example, 1 sccm to 100 sccm, and the flow rate of the second gas is, for example, 0.02 sccm to 2 sccm.

In addition, in step S9, gas for plasma generation is introduced into the plasma generation space E from the gas source 41a, and the microwave output power of the microwaves generated by the microwave generator 16 is maintained at the output power MW1. The microwave output power in step S9 is, for example, 2000 W to 4000 W. In addition, in an exemplary embodiment, the diluent gas supplied to the processing space P in step S7 is Ar gas. In addition, in an exemplary embodiment, in step S9, a bias power may be applied to the high frequency electrode from the high frequency power supply 25 in which the bias power may be in a range of 100 W to 500 W.

In step S9, the plasma is excited in the plasma generation space E, the plasma is supplied to the processing space P, and the raw material gas and the second gas are activated in the processing space P. As a result, as illustrated in FIG. 4(f), the active species of silicon ("Si" encircled by a circle in the drawing) and the active species of the second dopant material ("P" encircled by a circle in the drawing) react with the surface of the processing target base body W, that is, the surface of the i-type polycrystalline silicon layer H2 so that an n-type polycrystalline silicon layer H3 is grown on the flattened i-type polycrystalline silicon layer H2.

In the next step S10, the control unit 100 performs the second control again. More specifically, the supply of the raw material gas from the gas source 44a is stopped, the second gas from the gas source 46a is stopped, the inside of the processing container 12 is evacuated by the exhaust apparatus 23, the processing gas is supplied to the processing space P from the gas source 47a at the flow rate qr2, the diluent gas is supplied to the processing space P from the gas source 48a at the flow rate qh1, and the pressure within the processing container 12 is maintained at the pressure Pr1. The flow rate of the processing gas is, for example, 10 sccm to 100 sccm, and the flow rate of the diluent gas is, for example, 100 sccm to 1000 sccm. In step S10, the ratio of the flow rate qr2 of the processing gas in relation to the flow rate qh1 of the diluent gas is 10% or less. In addition, the pressure within the processing container 12 is 13 Pa or less.

In addition, in step S10, the gas for plasma generation is introduced into the plasma generation space E from the gas source 41a, and the microwave output power of the microwaves generated by the microwave generator 16 is maintained at the output power MW1. The microwave output power in step S10 is, for example, 2000 W to 4000 W. In addition, in step S10, the high frequency bias power RF2 is applied to the high frequency electrode from the high frequency power supply 25. In an exemplary embodiment, the diluent gas supplied to the processing space P in step S10 is, for example, Ar gas.

In step S10, the plasma is excited in the plasma generation space E, the plasma is supplied to the processing space P, and the processing gas is activated in the processing space P. As a result, as illustrated in FIG. 4(g), hydrogen radicals ("H" encircled by a circle) which are species of hydrogen are generated. The generated hydrogen radicals react with the surface of the n-type polycrystalline silicon layer H3 and etch the surface of the n-type polycrystalline silicon layer H3 to reduce the unevenness of the surface. Accordingly, in step S10, the surface roughness of the n-type polycrystalline silicon layer H2 which serves as an underlayer for following formation of the electrode layer may be reduced.

After steps S1 to S10 are terminated, as illustrated in FIG. 4(h), a product Y, which includes the p-type polycrystalline silicon layer H1, the i-type polycrystalline silicon layer H2, and the n-type polycrystalline silicon layer H3 laminated on the electrode layer TL on the semiconductor substrate Sub, is formed. In an exemplary embodiment, a pin type diode is manufactured by additionally forming an electrode on a surface of the product Y.

As described above, the present plasma processing method generates hydrogen radicals within the processing container 12, and exposes the surface of each layer to the hydrogen radicals. The hydrogen radicals etch the surface of each layer very slightly to reduce the unevenness of the surface. Thus, according to the present plasma processing method, the surface roughness of each layer is reduced. As a result, it is possible to suppress the effect of the surface roughness of an underlayer of each layer on the thickness distribution of each layer.

Surface processing technologies such as, for example, a chemical and mechanical polishing method (CMP method) is used as a method of reducing a surface roughness of a polycrystalline silicon layer. However, the surface processing technologies such as, for example, CMP, may increase the number of steps required for manufacturing a semiconductor device, and moreover, may lower productivity of a semiconductor device manufacturing process, thereby increasing a production cost.

Whereas, a plasma processing method of an exemplary embodiment controls kinds and flow rates of gases supplied to the processing container 12 so that a process of reducing the surface roughness of each layer and a process of growing polycrystalline silicon layers H1 to H3 may be performed in the same processing container 12. That is, steps S4, S6, S8, and S10 of exposing the processing target base body W or the polycrystalline silicon layers to hydrogen radicals may be performed in the same processing container 12 as that used in steps S5, S7, and S9 of growing the polycrystalline silicon layers H1 to H3. Accordingly, the plasma processing method does not require the steps of carrying the processing target base body W including the polycrystalline silicon layers H1 to H3 grown thereon out of the processing container 12, and providing the processing target base body W to another processing container. Accordingly, the present plasma processing method may suppress decreasing of the productivity of a semiconductor device manufacturing process, and may also suppress increase of a manufacturing cost. In addition, the present plasma processing method may grow different polycrystalline silicon layers H2 and H3 on flattened surfaces of polycrystalline silicon layers H1 to H3 without exposing the surface-flattened polycrystalline silicon layers H1 to H3 to external air. Accordingly, oxidation of flattened surfaces may be suppressed.

In an exemplary embodiment, as described above, in steps S4, S6, S8, and S10, a diluent gas is supplied into the processing container in addition to a processing gas. The ratio of the flow rate of the processing gas in relation to the flow rate of the diluent gas may be 10% or less. When the flow rate of $H_2$ gas and the flow rate of Ar gas are set to the ratio in this range, the generation efficiency of hydrogen radicals may be enhanced.

In an exemplary embodiment, as described above, in steps S4, S6, S8, and S10, the pressure within the processing container 12 is set to 13 Pa or less. When the pressure within the processing container 12 is set to a pressure in this range, the generation efficiency of hydrogen radicals may be further enhanced.

Figure 6:
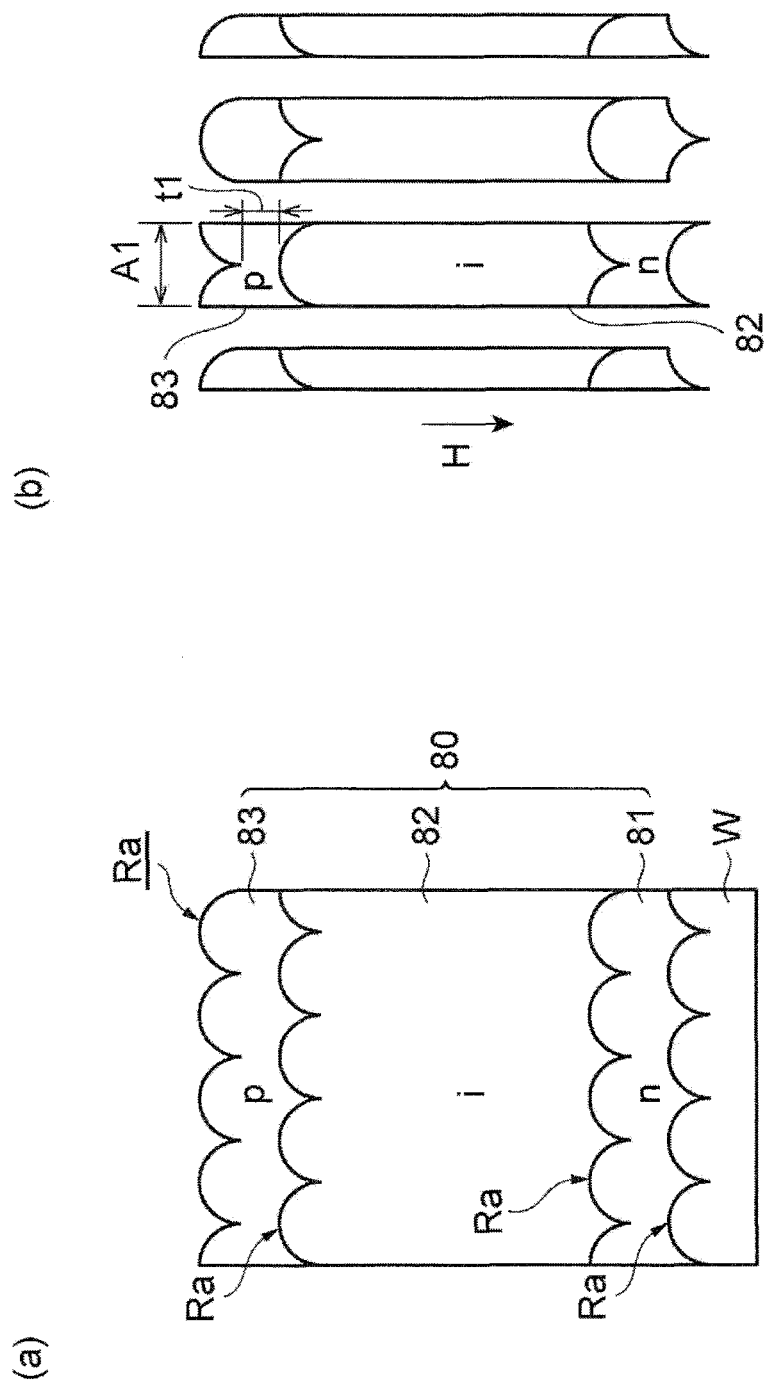
FIG. 6 illustrates views for describing a relationship between a thickness and a surface roughness of a semiconductor layer.

Hereinafter, a relationship between a surface roughness and a thickness of a polycrystalline silicon layer will be considered, and subsequently, a required surface roughness of a polycrystalline silicon layer will be considered. First, reference will be made to FIG. 6. FIG. 6(a) schematically illustrates a pin structure 80 grown on a processing target base body W. As illustrated in FIG. 6(a), the pin structure refers to a laminated structure including an n-type polycrystalline silicon layer 81, an i-type polycrystalline silicon layer 82, and a p-type polycrystalline silicon layer 83. The n-type polycrystalline silicon layer 81 is formed on the processing target base body W, and the i-type polycrystalline silicon layer 82 is formed on the n-type polycrystalline silicon layer 81. In addition, the p-type polycrystalline silicon layer 83 is formed on the i-type polycrystalline silicon layer 82.

When a semiconductor element having the pin structure 80 as a part thereof is manufactured, the pin structure 80 is cut and separated in a lamination direction H, as illustrated in FIG. 6(b). Here, as illustrated in FIG. 6(a), the surface of each of the polycrystalline silicon layers 81 to 83 has a surface roughness Ra formed when they are grown. As a result, the thickness of each layer is varied by a positional relationship between the unevenness of an underlayer and the unevenness of the layer surface from element to element, as illustrated in FIG. 6(b). For example, when the surface of the i-type polycrystalline silicon layer 82 of one element is formed as a convex region A1 and the surface of the p-type polycrystalline silicon layer 83 of this element is concave, the thickness t1 of the p-type polycrystalline silicon layer 83 becomes thinner than the thickness of the p-type polycrystalline silicon layer 83 of another element. As apparent from this, it is necessary to reduce the surface roughness of each layer.

Figure 7:
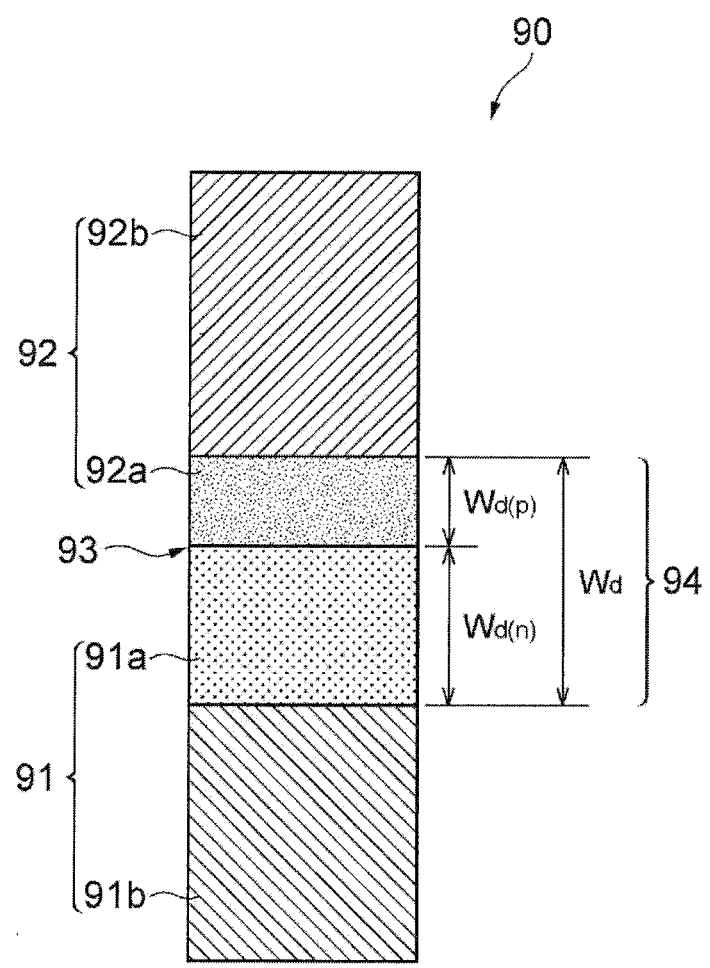
FIG. 7 is a view for describing a relationship between a thickness and an impurity concentration of a semiconductor layer.

Subsequently, a required surface roughness value of a polycrystalline silicon layer will be considered. FIG. 7 schematically illustrates a laminated structure 90 with a pn junction. In the laminated structure 90, a p-type polycrystalline silicon layer 92 is formed on an n-type polycrystalline silicon layer 91, and a pn junction 93 is interposed between the n-type polycrystalline silicon layer 91 and the p-type polycrystalline silicon layer 92. In this laminated structure 90, an n-side depletion layer 91a having a width $W_{d(n)}$ is generated in the n-type polycrystalline silicon layer 91 adjacent to the pn junction 93. In addition, a p-side depletion layer 92a having a width $W_{d(p)}$ is generated in the p-type polycrystalline silicon layer 92 adjacent to the pn junction 93.

The width $W_d$ of the depletion layer 94 depends on the concentration of an impurity doped on each of the p-type polycrystalline silicon layer 91 and the n-type polycrystalline silicon layer 92. Thus, a relationship between an impurity concentration and a width $W_{d(n)}$ of the n-side depletion layer 91a in the n-type polycrystalline silicon layer 91 and a relationship between an impurity concentration and a width $W_{d(p)}$ of the p-side depletion layer 92a in the p-type polycrystalline silicon layer 92 have obtained through calculation.

The impurity concentration and the width $W_{d(n)}$ of the n-side depletion layer 91a in the n-type polycrystalline silicon layer 91 are represented as the following Equation 1. In addition, the impurity concentration and the $W_{d(p)}$ of the p-side depletion layer 92a in the p-type polycrystalline silicon layer 92 are represented as the following Equation 2. In addition, as represented as the following Equation 3, the sum of the width $W_{d(n)}$ and the width $W_{d(p)}$ is the width $W_d$ of the depletion layer 94.

$$W_{d(n)} = \sqrt{\frac{2 \cdot \varepsilon_0 \cdot \varepsilon_{si}}{q} \cdot \frac{N_A}{N_D(N_A + N_D)} \cdot (\varphi_{bi} + V_R)} \quad \text{[Equation 1]}$$

$$W_{d(p)} = \sqrt{\frac{2 \cdot \varepsilon_0 \cdot \varepsilon_{si}}{q} \cdot \frac{N_D}{N_A(N_A + N_D)} \cdot (\varphi_{bi} + V_R)} \quad \text{[Equation 2]}$$

$$W_d = W_{d(p)} + W_{d(n)} \quad \text{[Equation 3]}$$

Here, $\varepsilon_0$ is a dielectric constant of vacuum. $\varepsilon_{si}$ is a specific dielectric constant of silicon. q is elementary charge. $N_A$ is an acceptor ion concentration, i.e., a hall concentration. $N_D$ is a donor ion concentration, i.e. an electron concentration. $\varphi_{bi}$ is an internal potential. $V_R$ is a reverse bias potential.

In addition, each parameter in Equations 1 to 3 was set as follows.

$\varepsilon_0$: $8.85 \times 10^{-14}$ [F/cm]
$\varepsilon_{si}$: 11.9 [—]
q: $1.60 \times 10^{-19}$ [C]
$N_A$: $1 \times 10^{15}$ to $1 \times 10^{21}$ [cm$^{-3}$]
$N_D$: $1 \times 10^{15}$ to $1 \times 10^{21}$ [cm$^3$]
$\varphi_{bi}$: 1.031 [V]
$V_R$: 0.1 [V]

Figure 8:
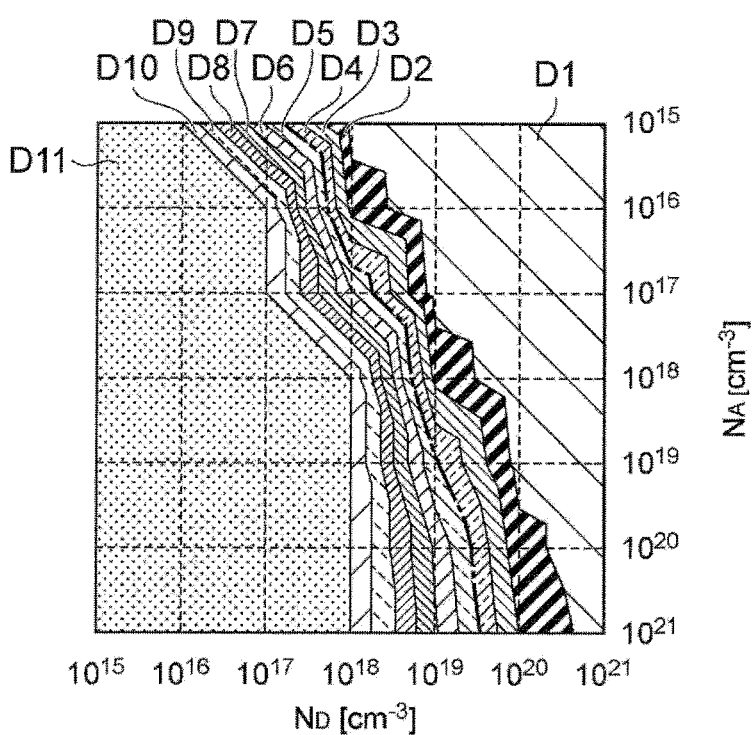
FIG. 8 illustrates views for describing a relationship between a thickness and an impurity concentration of a semiconductor layer.
Figure 8:
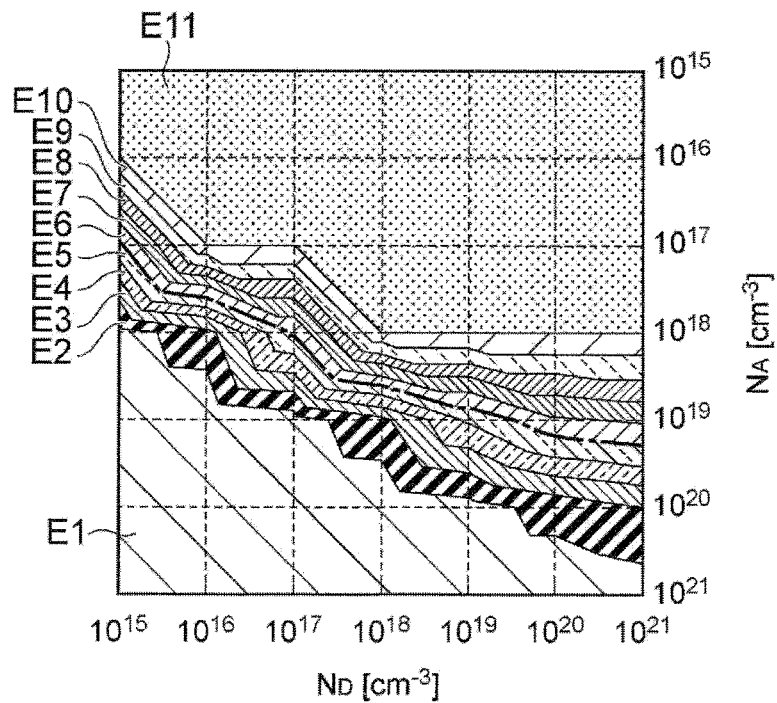

FIG. 8(a) represents a calculation result of a width $W_{d(n)}$ of an n-side depletion layer 91a calculated based on Equation 1 while changing the hall concentration $N_A$ and the electron concentration $N_D$ as parameters. The horizontal axis of FIG. 8(a) represents the electron concentration $N_D$ and the vertical axis represents the hall concentration $N_A$. In the calculation, each of the electron concentration $N_D$ and the concentration $N_A$ was changed between $1 \times 10^{15}$ cm$^{-3}$ and $1 \times 10^{21}$ cm$^{-3}$.

In FIG. 8(a), region D1 represents a region where the width $W_{d(n)}$ of the n-side depletion layer 91a is 0 nm to 2.0 nm, region D2 represents a region where the width $W_{d(n)}$ of the n-side depletion layer 91a is 2.0 nm to 4.0 nm, and region D3 represents a region where the width $W_{d(n)}$ of the n-side depletion layer 91a is 4.0 nm to 6.0 nm. In addition, region D4 represents a region where the width $W_{d(n)}$ of the n-side depletion layer 91a is 6.0 nm to 8.0 nm, region D5 represents a region where the width $W_{d(n)}$ of the n-side depletion layer 91a is 8.0 nm to 10.0 nm, and region D6 represents a region where the width $W_{d(n)}$ of the n-side depletion layer 91a is 10.0 nm to 12.0 nm. Region D7 represents a region where the width $W_{d(n)}$ of the n-side depletion layer 91a is 12.0 nm to 14.0 nm, region D8 represents a region where the width $W_{d(n)}$ of the n-side depletion layer 91a is 14.0 nm to 16.0 nm, and region D9 represents a region where the width $W_{d(n)}$ of the n-side depletion layer 91a is 16.0 nm to 18.0 nm. Region D10 represents a region where the width $W_{d(n)}$ of the n-side depletion layer 91a is 18.0 nm to 20.0 nm, and region D11 represents a region where the width $W_{d(n)}$ of the n-side depletion layer 91a is larger than 20.0 nm.

FIG. 8(b) represents a calculation result of a width $W_{d(p)}$ of a p-side depletion layer 91a calculated based on Equation 1 while changing the hall concentration $N_A$ and the electron concentration $N_D$ as parameters. The horizontal axis of FIG. 8(b) represents the electron concentration $N_D$ and the vertical axis represents the hall concentration $N_A$. In the calculation, each of the electron concentration $N_D$ and the concentration $N_A$ was changed between $1 \times 10^{15}$ cm$^{-3}$ and $1 \times 10^{21}$ cm$^{-3}$.

In FIG. 8(b), region E1 represents a region where the width $W_{d(p)}$ of the p-side depletion layer 92a is 0 nm to 2.0 nm, region E2 represents a region where the width $W_{d(p)}$ of the p-side depletion layer 92a is 2.0 nm to 4.0 nm, and region E3 represents a region where the width $W_{d(p)}$ of the p-side depletion layer 92a is 4.0 nm to 6.0 nm. In addition, region E4 represents a region where the width $W_{d(p)}$ of the p-side depletion layer 92a is 6.0 nm to 8.0 nm, region E5 represents a region where the width $W_{d(p)}$ of the p-side depletion layer 92a is 8.0 nm to 10.0 nm, and region E6 represents a region where the width $W_{d(p)}$ of the p-side depletion layer 92a is 10.0 nm to 12.0 nm. Region E7 represents a region where the width $W_{d(p)}$ of the p-side depletion layer 92a is 12.0 nm to 14.0 nm, region E8 represents a region where the width $W_{d(p)}$ of the p-side depletion layer 92a is 14.0 nm to 16.0 nm, and region E9 represents a region where the width $W_{d(p)}$ of the p-side depletion layer 92a is 16.0 nm to 18.0 nm. Region E10 represents a region where the width $W_{d(p)}$ of the p-side depletion layer 92a is 18.0 nm to 20.0 nm, and region E11 represents a region where the width $W_{d(p)}$ of the p-side depletion layer 92a is larger than 20.0 nm.

Here, in order to make the laminated structure 90 function as a diode, that is, suppress a reverse current to exhibit a rectification property, the thickness of the n-type polycrystalline silicon layer 91 and the thickness of the p-type polycrystalline silicon layer 92 are required to be larger than the width $W_{d(n)}$ of the n-side depletion layer 91a and the width $W_{d(p)}$ of the p-side depletion layer 92a, respectively. Accordingly, it can be seen from FIGS. 8A and 8B that, assuming that each of the thicknesses of the n-type polycrystalline silicon layer 91 and the p-type polycrystalline silicon layer 92 is 5 nm, each of the width $W_{d(n)}$ of the n-side depletion layer 91a and the width $W_{d(p)}$ of the p-side depletion layer 92a may be set to 0 nm to 4.0 nm by doping the n-type polycrystalline silicon layer 91 and the p-type polycrystalline silicon layer 92 with impurities of $5\times10^{20}$ cm$^{-3}$. In addition, assuming that depletion layers 91a and 91b with a width of 4 nm may be generated in n-type and p-type polycrystalline silicon layers 91 and 92 with a thickness of 5 nm, the surface roughness Ra of the n-type and p-type polycrystalline silicon layers 91 and 92 is required to be 1 nm or less.

Figure 9:
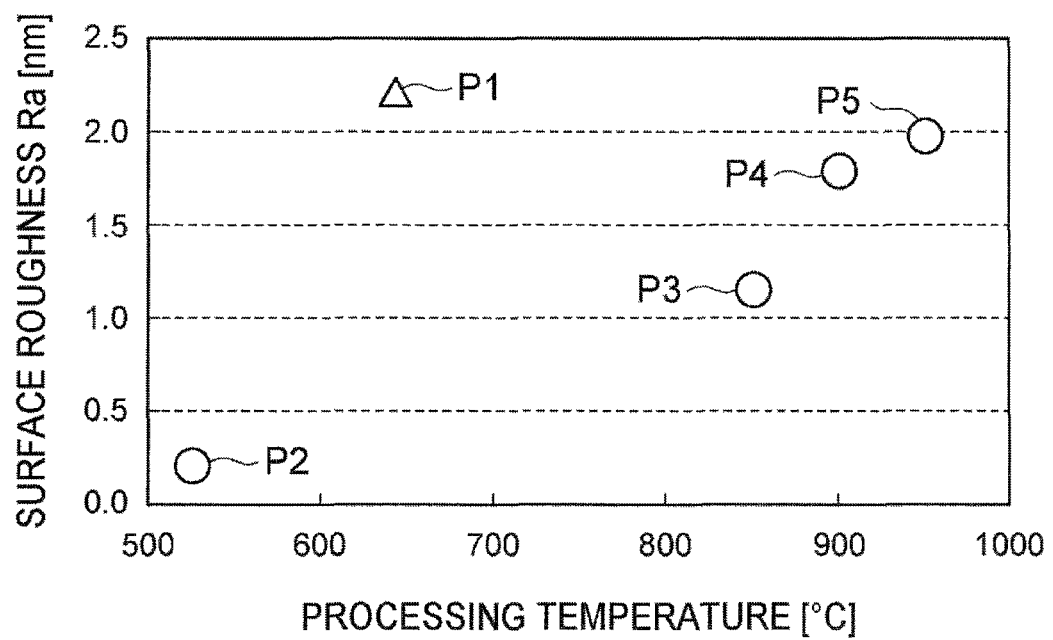
FIG. 9 is a graph representing a relationship between a surface roughness and a processing temperature of a polycrystalline silicon layer formed by a conventional method.

However, a polycrystalline silicon layer formed by a thermal CVD method has a surface roughness value larger than 1 nm. In addition, a polycrystalline silicon layer obtained by applying thermal annealing to an amorphous silicon layer formed by the CVD method also has a surface roughness value larger than 1 nm. This fact is represented in FIG. 9. In FIG. 9, the horizontal axis represents a processing temperature which is a growth temperature or an annealing temperature, and the vertical axis represents a surface roughness Ra of a polycrystalline silicon layer. In FIG. 9, plot P1 represents a surface roughness Ra of a polycrystalline silicon layer formed by the thermal CVD method, plot P2 represents a surface roughness Ra of an amorphous silicon layer formed by the thermal CVD method, and plots P3 to P5 represents surface roughnesses Ra of polycrystalline silicon layers obtained by applying thermal annealing to amorphous silicon layers formed by the thermal CVD method. As illustrated in FIG. 9, the polycrystalline silicon layers obtained by the conventional method have a surface roughness Ra exceeding 1 nm. Meanwhile, according to a plasma processing method of an exemplary embodiment, it is possible to obtain a polycrystalline silicon layer which has a surface roughness Ra of 1 nm or less. This may be found from, for example, Test Example 1 blow.

Hereinafter, Test Examples 1 to 4 performed using the plasma processing apparatus 10 will be described.

Test Example 1

In Test Example 1, surfaces of polycrystalline silicon layers were processed using an exposure time of the polycrystalline silicon layers in relation to hydrogen radicals as a variable parameter. In Test Example 1, the processing conditions of the polycrystalline silicon semiconductor layers were as follows.

Figure 10:
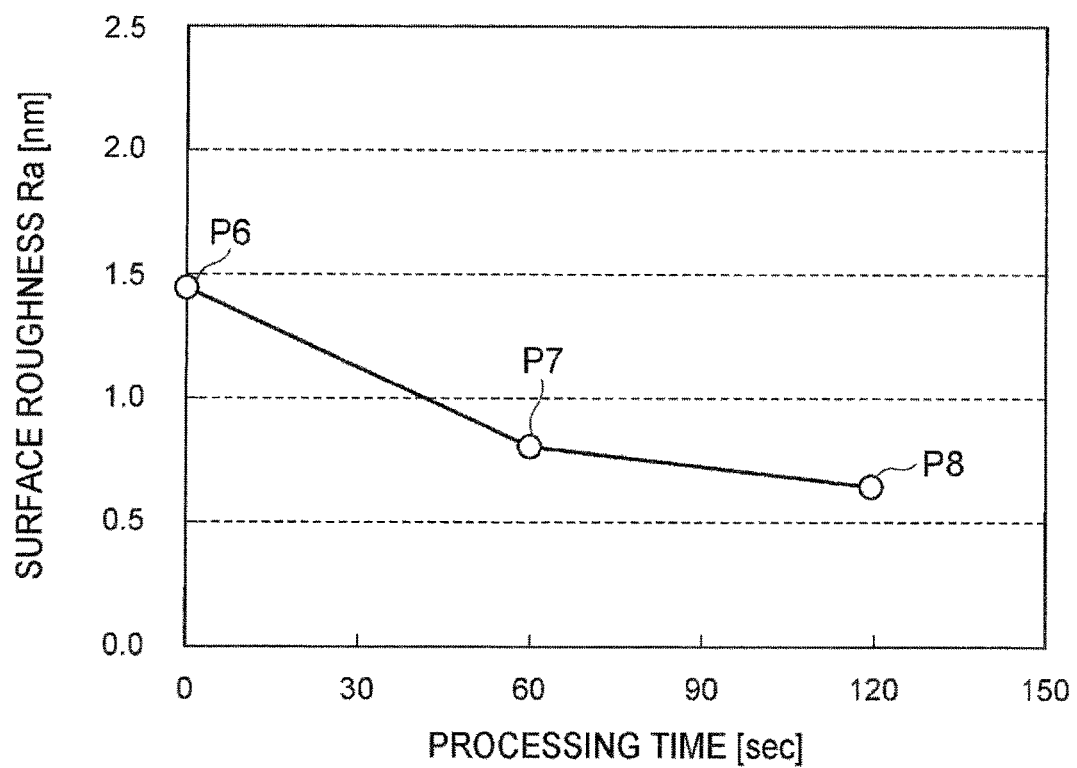
FIG. 10 is a graph representing a relationship between a processing time and a surface roughness of a polycrystalline silicon layer according to Test Example 1.

Thickness of polycrystalline silicon layer: 100 nm
Flow rate of processing gas $H_2$: 30 sccm
Flow rate of diluent gas (Ar): 1000 sccm
Microwave output power: 4000 W
Frequency of microwaves: 2.45 GHz
Pressure within processing container: 4 Pa
Bias power: 400 W In Test Example 1, the surface roughness Ra of the polycrystalline silicon layer exposed to hydrogen radicals for a predetermined time was measured using an atomic force microscope AFM. The surface roughness Ra refers to arithmetic average roughness Ra prescribed in JIS B 0601: 2001. Results of Test Example 1 are represented in FIG. 10. The horizontal axis of FIG. 10 represents of an exposure time of a polycrystalline silicon layer to hydrogen radicals, and the vertical axis surface roughness Ra of the polycrystalline silicon layer. As apparent from FIG. 10, it has been found through Test Example 1 that the surface roughness Ra of the polycrystalline silicon layer has correlation with the processing time. More specifically, the surface roughness Ra of the polycrystalline silicon layer before processing was 1.5 m (reference symbol P6), the surface roughness Ra of the polycrystalline silicon layer after exposure to hydrogen radicals for 60 seconds was 0.8 nm (reference symbol P7), and the surface roughness Ra of the polycrystalline silicon layer after exposure to hydrogen radicals for 120 seconds was 0.6 nm (reference symbol P8). Accordingly, through Test Example 1, it has been found that when the polycrystalline silicon layer is exposed to hydrogen radicals for 60 seconds or more, the surface roughness Ra may be controlled to be 1.0 nm or less.

Test Example 2

In Test Example 2, a surface of a polycrystalline silicon layer was processed using an exposure time to hydrogen radicals as a variable parameter. In Test Example 2, the processing conditions of the polycrystalline silicon layer are the same as those of Test Example 1. In Test Example 2, a crystallization rate of a polycrystalline silicon layer exposed to hydrogen radicals for a predetermined time was evaluated. The crystallization rate was measured using a Raman spectroscopy method. In addition, in Test Example 2, the film thickness of the polycrystalline silicon layer exposed to hydrogen radicals for the predetermined time was measured. The film thickness was measured using a scanning electron microscope image (SEM image).

Figure 11:
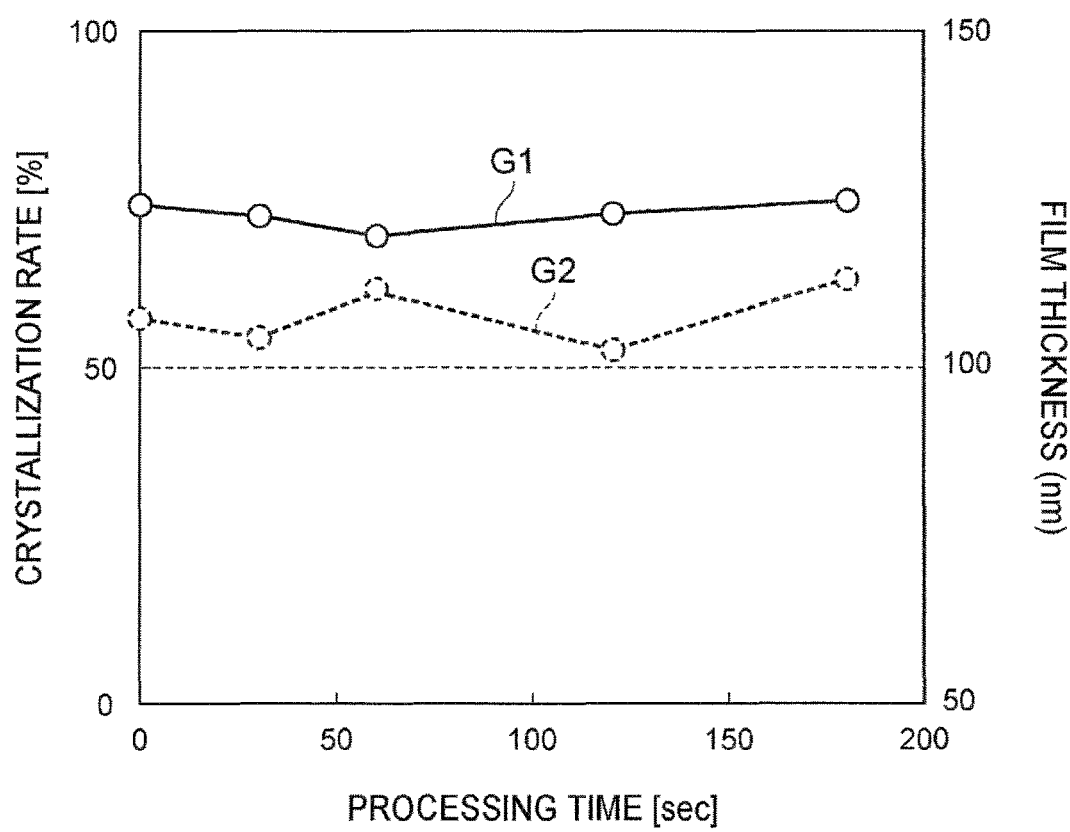
FIG. 11 is a graph representing a relationship between a processing time and a crystallization rate and a relationship between a processing time and a film thickness of a polycrystalline silicon layer according to Test Example 2.

The results of Test Example 2 are represented in FIG. 11. The horizontal axis of FIG. 11 represents a processing time, the left vertical axis represents a crystallization rate, and the right vertical axis represents a film thickness. Graph G1 in FIG. 11 represents measured results of the crystallization rate, and graph G2 represents the film thickness.

As apparent from graph G1 in FIG. 11, the crystallization rate did not exhibit a significant dependency on the exposure time of the polycrystalline silicon layer to hydrogen plasma. In addition, as apparent from graph G2 in FIG. 11, the thickness of the polycrystalline silicon layer did not exhibit a significant dependence on the exposure time of the polycrystalline silicon layer to hydrogen plasma. From this, it has been found that as the exposure time of the polycrystalline silicon to hydrogen plasma increases, the surface roughness of the polycrystalline silicon layer may be reduced without affecting the crystallization rate and film thickness of the polycrystalline silicon layer.

Test Example 3

In Test Example 3, a relationship between the pressure within the processing container 12 and the generation amount of hydrogen radicals was evaluated. That is, in Test Example 3, the generation amount of hydrogen radicals was evaluated using the pressure within the processing container 12 as a variable parameter. The conditions of Test Example 3 were as follows.

Flow rate of processing gas ($H_2$): 100 sccm
Flow rate of diluent gas (Ar): 1000 sccm
Microwave output power: 2000 W
Frequency of microwaves: 2.45 GHz
Pressure within processing container: 0.1 Torr (13 Pa), 0.5 Torr (67 Pa), 3.0 Torr (399 Pa), and 9.5 Torr (1264 Pa)

Figure 12:
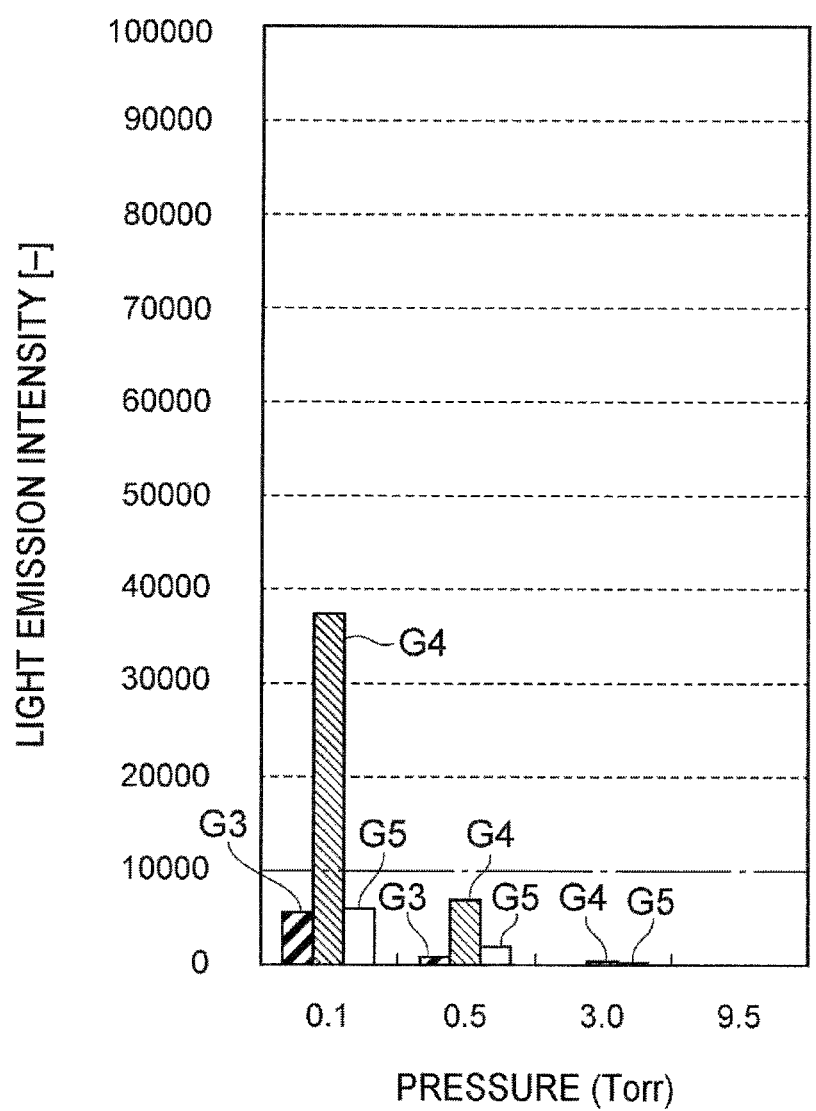
FIG. 12 is a graph representing a relationship between a pressure within a processing container and a generated amount of hydrogen radicals according to Test Example 3.

The generation amount of hydrogen radicals was evaluated by measuring a count number in emission wavelength of hydrogen radicals. In addition, the generation amount of argon radicals was also evaluated by measuring a count number in emission wavelength of argon radicals. Further, the counts were measured using a spectroscopic apparatus (SD1024 manufactured by Verity Instruments, Inc.). The results are represented in FIG. 12. The horizontal axis of FIG. 12 represents a pressure within a processing container and the vertical axis represents a light emission intensity, i.e. counts. In FIG. 12, graph G3 represents the count number of emission wavelength 486 nm of hydrogen radicals, graph G4 represents the count number of emission wavelength 658 nm of hydrogen radicals, and graph G5 represents the count number of emission wavelength 750 nm of argon radicals.

Here, it is believed that hydrogen radicals are efficiently generated when the count number in the emission efficiency (658 nm) of hydrogen radicals is 10000 or more. Accordingly, as apparent from FIG. 12, it has been found that when the pressure within the processing container 12 is set to 0.1 Torr (13 Pa) or less, the generation efficiency of hydrogen radicals is enhanced so that hydrogen radicals required for efficiently processing a polycrystalline silicon layer can be obtained.

Test Example 4

In Test Example 4, a relationship between a ratio of the flow rate of hydrogen gas and the flow rate of argon gas and the generation amount of hydrogen radicals was evaluated. That is, in Test Example 4, the generation amount of hydrogen radicals was evaluated using the ratio of the flow rate of hydrogen gas and the flow rate of argon gas as a parameter. The conditions of Test Example 4 were as follows.

Flow rate of processing gas ($H_2$): 20 sccm, 50 sccm, 100 sccm, and 500 sccm

Flow rate of diluent gas (Ar): 50 sccm, 500 sccm, and 1000 sccm

Microwave output power: 2000 W

Frequency of microwaves: 2.45 GHz

Pressure within processing container: 13 Pa

In Test Example 4, the generation amounts of hydrogen radicals and argon radicals were also measured as in Test Example 3. The results are represented in FIG. 13. The horizontal axes of FIGS. 13(a), 13(b), and 13(c) represent a flow rate of hydrogen gas, and the vertical axes represent light emission intensity, i.e. a count number. In FIG. 13, graph G3 represents the count number of emission wavelength 486 nm of hydrogen radicals, graph G4 represents the count number of emission wavelength 658 nm of hydrogen radicals, and graph G5 represents the count number of emission wavelength 750 nm of argon radicals. FIG. 13(a) represents measurement results when the flow rate of Ar gas was set to 1000 sccm, FIG. 13(b) represents measurement results when the flow rate of Ar gas was set to 500 sccm, and FIG. 13(c) represents measurement results when the flow rate of Ar gas was set to 50 sccm.

As described above, it is believed that hydrogen radicals are efficiently generated when the count number in the emission wavelength (658 nm) of hydrogen radicals is 10000 or more. As illustrated in FIG. 13(a), in a case where the flow rate of Ar gas was 1000 sccm, hydrogen radicals were efficiently generated when the flow rate of hydrogen gas is 100 sccm, that is, when the ratio of the flow rate of the hydrogen gas in relation to the flow rate of Ar gas was 10% or less. In addition, as illustrated in FIG. 13(b), in a case where the flow rate of Ar gas was 500 sccm, hydrogen radicals were efficiently generated when the flow rate of hydrogen gas was 100 sccm, that is, when the ratio of the flow rate of hydrogen gas in relation to the flow rate of Ar gas was 20% or less. Further, as illustrated in FIG. 13(c), in a case where the flow rate of Ar gas was 50 sccm, hydrogen radicals were efficiently generated when the flow rate of hydrogen gas was 20 sccm, that is, when the ratio of the flow rate of hydrogen gas in relation to the flow rate of Ar gas was 40% or less. As a result, it has been found that when the ratio of hydrogen gas in relation to the flow rate of argon gas is set to 10% or less, hydrogen radicals may be efficiently generated regardless of the absolute amount of the flow rate of argon gas.

In the foregoing, various exemplary embodiments have been described but various modified embodiments may be made without limiting to the exemplary embodiments described above. Steps S4 to S10 may be performed in different processing containers, respectively. For example, the plasma processing apparatus may include a first processing container configured to process a polycrystalline silicon layer, and a second processing container configured to grow the polycrystalline silicon layer. A processing target base body W having a polycrystalline silicon layer grown thereon may be reciprocated between the first processing container and the second processing container so that steps S4, S6, S8, and S10 of processing the polycrystalline silicon layer may be performed in the first processing container and steps S5, S7, and S9 of growing the polycrystalline silicon layer may be performed in the second processing container.

In the foregoing description, an exemplary embodiment, in which the flow rate qr1 of the processing gas in each of step S5 of forming a p-type polycrystalline silicon layer H1, step S7 of forming an i-type polycrystalline silicon layer H2, and step S9 of forming an n-type polycrystalline silicon layer H3 is smaller than the flow rate qr2 of the processing gas in each of steps S4, S6, and S8 of performing a processing using hydrogen radicals before steps S5, S7, and S9, has been described, but the present disclosure is not limited thereto. For example, the flow rate qr1 of the processing gas in each of steps S5, S7, and S9 may be set to a desired flow rate. For example, the flow rate qr1 of the processing gas may be larger than, equal to, or smaller than the flow rate qr2 of the processing gas. In addition, the supply of the processing gas may be stopped. In addition, the flow rates qr1 of the processing gas in steps S5, S7, and S9 may be different from each other.

In the foregoing description, an exemplary embodiment, in which the flow rate of the diluent gas in each of step S5 of forming a p-type polycrystalline silicon layer H1, step S7 of forming an i-type polycrystalline silicon layer H2, and step S9 of forming an n-type polycrystalline silicon layer H3 is set to be equal to the flow rate qh1 of the diluent gas in each of steps S4, S6, and S8 of performing a processing using hydrogen radicals before steps S5, S7, and S9, has been described, but the present disclosure is not limited thereto. The flow rate of the diluent gas in each of steps S5, S7, and S9 may be set to a desired flow rate. For example, the flow rate of the diluent gas may be larger than, equal to, or smaller than the flow rate qh1 of the processing gas in steps S4, S6, and S7. In addition, the supply of the processing gas may be stopped. Further, the flow rates qh1 of the diluent gas in steps S5, S7, and S9 may be different from each other.

DESCRIPTION OF SYMBOLS

10: plasma processing apparatus
12: processing container

14: stage (mounting table)
16: microwave generator
22: pressure regulation unit
25: high frequency power supply
41, 43: gas introduction unit
42: shower plate
100: control unit
E: plasma generation space
P: processing space
H1: p-type polycrystalline silicon layer (first conductive type polycrystalline silicon layer)
H2: i-type polycrystalline silicon layer (i-type polycrystalline silicon layer)
H3: n-type polycrystalline silicon layer (second conductive type polycrystalline silicon layer)
W: processing target base body

What is claimed is:

1. A plasma processing method comprising:
supplying a silicon-containing raw material into a processing container and radiating microwaves within the processing container, thereby growing a polycrystalline silicon layer on a processing target base body accommodated in the processing container;
supplying a silicon-free processing gas containing hydrogen-containing gas into the processing container that accommodates the processing target base body including the polycrystalline silicon layer grown thereon and radiating the microwaves within the processing container to generate hydrogen radicals, thereby exposing the polycrystalline silicon layer to the hydrogen radicals and etching a surface of the polycrystalline silicon layer such that a surface roughness of the polycrystalline silicon layer is reduced; and
sequentially repeating the step of growing of the polycrystalline silicon layer and the step of exposing of the polycrystalline silicon layer to the hydrogen radicals.

2. The plasma processing method of claim 1, wherein the exposing of the polycrystalline silicon layer to the hydrogen radicals is performed in the same processing container as the growing of the polycrystalline silicon layer.

3. The plasma processing method of claim 1, wherein the growing of the polycrystalline silicon layer includes at least one of:
growing a first polycrystalline silicon layer on the processing target base body by supplying the silicon-containing raw material gas and a first gas containing a first dopant material into the processing container and radiating the microwaves within the processing container;
growing an i-type polycrystalline silicon layer on the first polycrystalline silicon layer by supplying the raw material gas into the processing container and radiating the microwaves within the processing container; and
growing a second polycrystalline silicon layer on the i-type polycrystalline silicon layer by supplying the raw material gas and a second gas containing a second dopant material and radiating the microwaves within the processing container.

4. The plasma processing method of claim 1, further comprising:
before the growing of the polycrystalline silicon layer, exposing the processing target base body to the hydrogen radicals by supplying the processing gas into the processing container and radiating the microwaves within the processing container to generate the hydrogen radicals,
wherein a surface of the processing target base body is a surface of an electrode layer.

5. The plasma processing method of claim 1, wherein the microwaves are radiated from a radial line slot antenna.

6. The plasma processing method of claim 1, wherein the hydrogen-containing gas is hydrogen gas.

7. The plasma processing method of claim 1, wherein a diluent gas is further supplied into the processing container together with the processing gas, and
a ratio of a flow rate of the hydrogen-containing gas in relation to a flow rate of the diluent gas is 10% or less.

8. The plasma processing method of claim 1, wherein, in the exposing of the polycrystalline silicon layer to the hydrogen radicals and in the exposing of the processing target base body to the hydrogen radicals, a pressure within the processing container is set to 13 Pa or less.

9. The plasma processing method of claim 1, wherein an exposure time of the polycrystalline silicon layer to the hydrogen radicals is 60 seconds or more.

10. The plasma processing method of claim 1, wherein the step of exposing exposes the polycrystalline silicon layer to the hydrogen radicals until the surface roughness of the polycrystalline silicon layer becomes 1.0 nm or less as an arithmetic average roughness.

* * * * *